US008773612B2

(12) United States Patent
Sanpei et al.

(10) Patent No.: US 8,773,612 B2
(45) Date of Patent: Jul. 8, 2014

(54) LIGHT EMITTING MODULE AND ILLUMINATION APPARATUS

(75) Inventors: Tomohiro Sanpei, Yokosuka (JP); Kiyoshi Otani, Yokosuka (JP); Masahiro Izumi, Yokosuka (JP); Junya Murata, Yokosuka (JP); Akiko Saito, Yokosuka (JP); Yumiko Hayashida, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 352 days.

(21) Appl. No.: 13/202,689

(22) PCT Filed: Feb. 26, 2010

(86) PCT No.: PCT/JP2010/053136
§ 371 (c)(1),
(2), (4) Date: Aug. 22, 2011

(87) PCT Pub. No.: WO2010/098457
PCT Pub. Date: Sep. 2, 2010

(65) Prior Publication Data
US 2011/0303927 A1  Dec. 15, 2011

(30) Foreign Application Priority Data

Feb. 27, 2009  (JP) ................................ 2009-046739
Feb. 27, 2009  (JP) ................................ 2009-046740
Feb. 27, 2009  (JP) ................................ 2009-046741
Feb. 25, 2010  (JP) ................................ 2010-039563

(51) Int. Cl.
*G02F 1/1335* (2006.01)
(52) U.S. Cl.
USPC .................. 349/61; 349/56; 349/62; 349/63; 349/64

(58) Field of Classification Search
USPC ...................... 349/56, 61, 62, 63, 64
See application file for complete search history.

(56) References Cited

U.S. PATENT DOCUMENTS

2012/0014110 A1*  1/2012  Sanpei et al. ............ 362/296.04

FOREIGN PATENT DOCUMENTS

CN  1625812  6/2005
JP  2002-110704  4/2002
(Continued)

OTHER PUBLICATIONS

Japanese Office Action issued in JP 2010-255672 on Jul. 12, 2012.
(Continued)

*Primary Examiner* — Jennifer Doan
(74) *Attorney, Agent, or Firm* — DLA Piper LLP (US)

(57) ABSTRACT

A light emitting module (1) comprises a module substrate (2), a light emitting diode string (31), and a sealing member (48). The light emitting diode string (31) includes light emitting diode elements (32) and bonding wires (37) which connect the light emitting diode elements (32). The light emitting diode element (32) has a pair of element electrodes (33, 34) and has a rectangular shape extending in a direction along which the element electrodes (33, 34) are aligned. The sealing member (48) is laminated on the module substrate (2) to seal the light emitting diode string (31). The light emitting diode elements (32) are arranged at intervals in a direction crossing the direction along which the element electrodes (33, 34) are aligned, and the element electrodes (33, 34) with the same polarity are aligned to be adjacent to each other in an arrangement direction of the light emitting diode elements (32) between the light emitting diode elements (32) adjacent to each other. Each bonding wire (37) is obliquely wired with respect to the arrangement direction of the light emitting diode elements (32) to connect the element electrodes (33, 34) with different polarities of the light emitting diode elements (32) adjacent to each other.

12 Claims, 12 Drawing Sheets

(56) References Cited

FOREIGN PATENT DOCUMENTS

| | | |
|---|---|---|
| JP | 2007-324275 | 12/2007 |
| JP | 2008-066691 | 3/2008 |
| JP | 2008-071895 | 3/2008 |
| JP | 2008-078401 | 4/2008 |
| JP | 2008-147512 | 6/2008 |
| JP | 2008-159753 | 7/2008 |
| JP | 2008-244165 | 10/2008 |
| JP | 2008-277561 | 11/2008 |
| JP | 2009-037995 | 2/2009 |
| KR | 10-2004-0093686 | 11/2004 |
| WO | WO 2008/069204 | 6/2008 |

OTHER PUBLICATIONS

English Language Translation of Japanese Office Action issued in JP 2010-255672 on Jul. 12, 2012.
English Language Abstract of JP2008-147512 published on Jun. 26, 2008.
English Language Translation of JP2008-147512 published on Jun. 26, 2008.
English Language Abstract of JP 2007-324275 published on Dec. 13, 2007.
English Language Translation of JP 2007-324275 published on Dec. 13, 2007.
Chinese Office Action issued in CN 201080009903.6 on Dec. 31, 2012.
English Language Translation of Chinese Office Action issued in CN 201080009903.6 on Dec. 31, 2012.
English Language Abstract of CN 1625812 published Jun. 8, 2005.
English Language Translation of International Preliminary Report on Patentability and Written Opinion for PCT/JP2010/053136 dated Sep. 22, 2011.
International Search Report issued in PCT/JP2010/053136 on Apr. 6, 2010.
English Language Abstract of JP 2008-277561 published Nov. 13, 2008.
English Language Translation of JP 2008-277561 published Nov. 13, 2008.
English Language Abstract of JP 2008-159753 published Jul. 10, 2008.
English Language Translation of JP 2008-159753 published Jul. 10, 2008.
English Language Abstract of JP 2008-071895 published Mar. 27, 2008.
English Language Translation of JP 2008-071895 published Mar. 27, 2008.
English Language Abstract of JP 2009-037995 published Feb. 19, 2009.
English Language Translation of JP 2009-037995 published Feb. 19, 2009.
English Language Abstract of JP 2008-066691 published Mar. 21, 2008.
English Language Translation of JP 2008-066691 published Mar. 21, 2008.
English Language Abstract of WO 2008/069204 published Jun. 12, 2008.
Japanese Office Action issued in JP 2010-039563 mailed on May 7, 2013.
English Language Translation of Japanese Office Action issued in JP 2010-039563 mailed on May 7, 2013.
English Language Abstract of JP 2008-244165 published Oct. 9, 2008.
English Language Translation of JP 2008-244165 published Oct. 9, 2008.
English Language Abstract of JP 2008-078401 published Apr. 3, 2008.
English Language Translation of JP 2008-078401 published Apr. 3, 2008.
English Language Abstract of JP 2002-110704 published Apr. 12, 2002.
English Language Translation of JP 2002-110704 published Apr. 12, 2002.
Korean Office Action issued in 10-2011-7019555 on Sep. 17, 2012.
English Language Translation of Korean Office Action issued in 10-2011-7019555 on Sep. 17, 2012.
English Language Abstract of KR10-2004-0093686 published Nov. 8, 2004.
Chinese Office Action issued in CN 201080009903.6 on Aug. 26, 2013.
English Language Translation of Chinese Office Action issued in CN 201080009903.6 on Aug. 26, 2013.

* cited by examiner

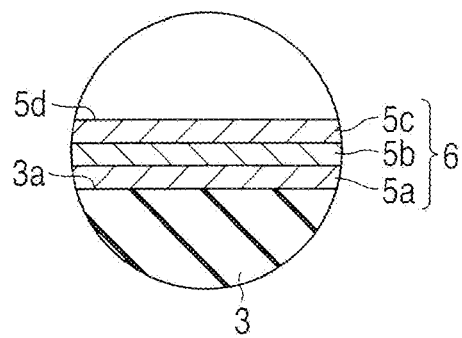
F I G. 4
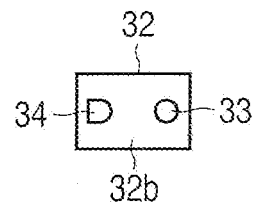
F I G. 5
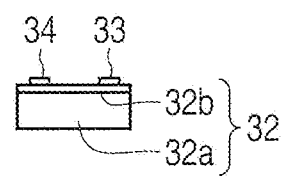
F I G. 6

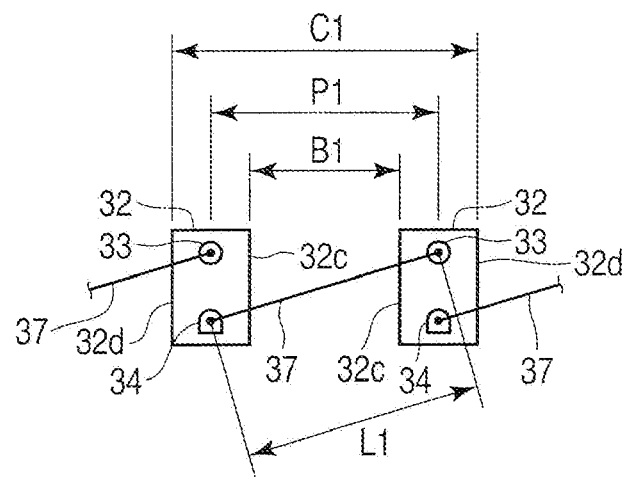
F I G. 7
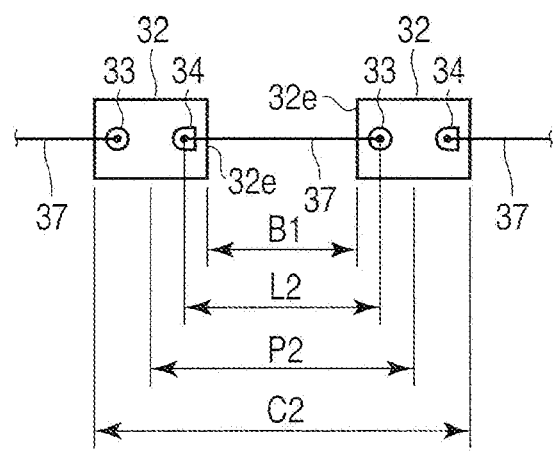
F I G. 8

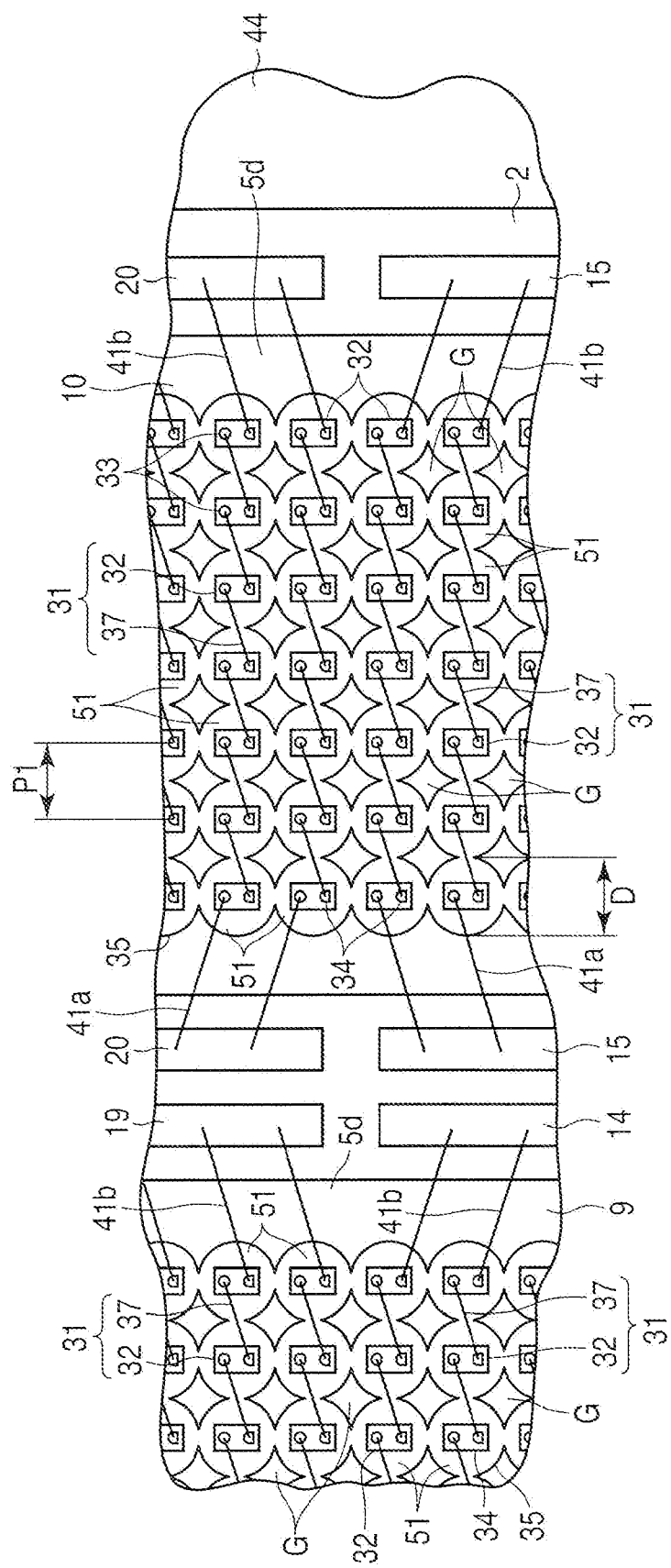
F I G. 11

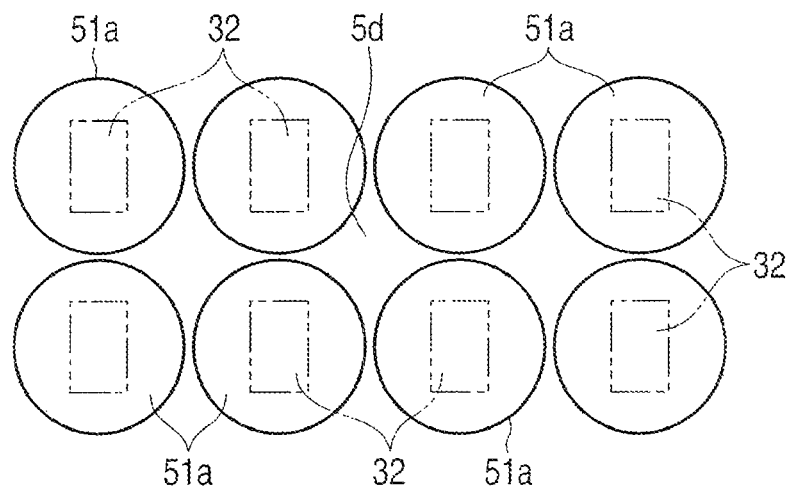
F I G. 12
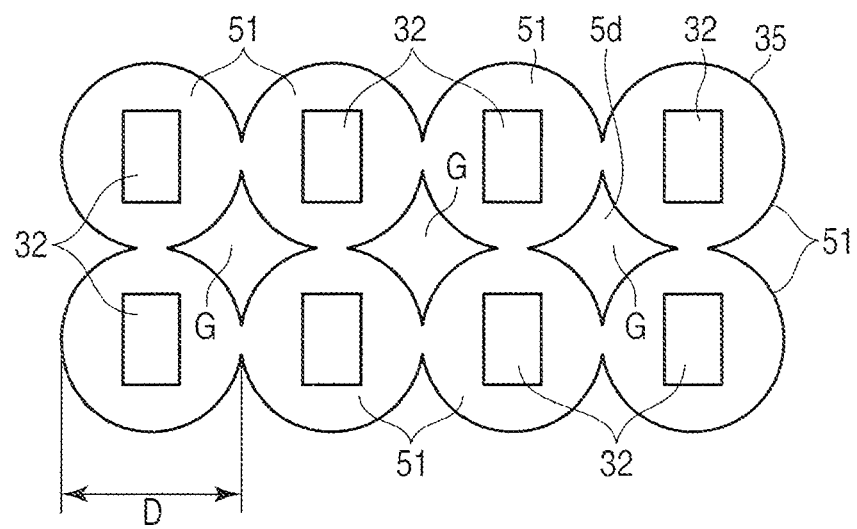
F I G. 13

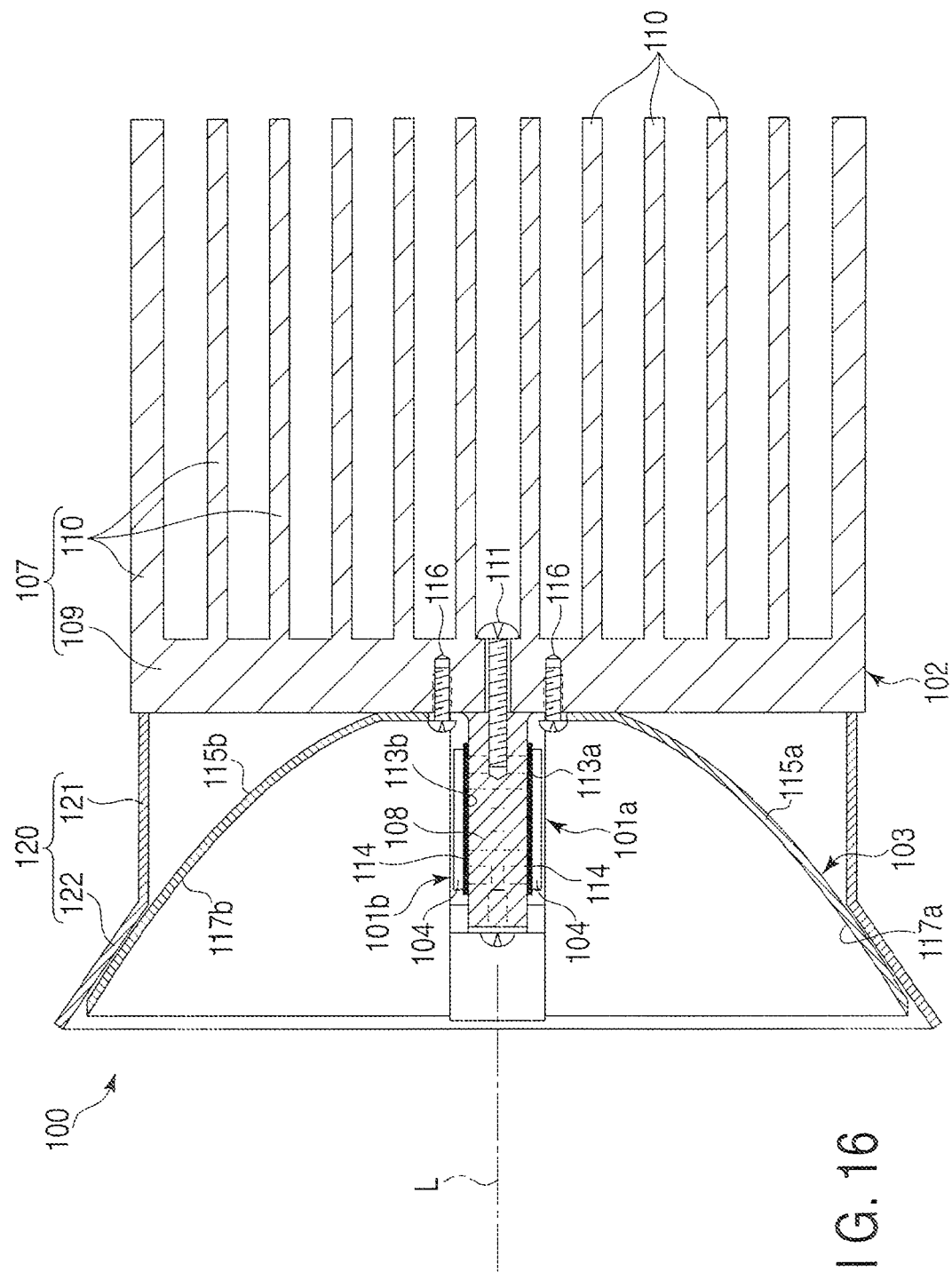
F I G. 16

LIGHT EMITTING MODULE AND ILLUMINATION APPARATUS

CROSS-REFERENCE TO RELATED APPLICATIONS

This is a U.S. National Phase application under 35 USC 371 of International Application No. PCT/JP2010/053136 (not published in English), filed Feb. 26, 2010, which, in turn, claims the benefit of Japanese Patent Application Nos. 2009-046739, filed on Feb. 27, 2009; 2009- 046740, filed on Feb. 27, 2009; 2009- 046741, filed on Feb. 27, 2009; and 2010-039563 filed on Feb. 25, 2010.

TECHNICAL FIELD

The present invention relates to a light emitting module having a plurality of light emitting diode elements. Furthermore, the present invention relates to an illumination apparatus that uses a light emitting module having a plurality of light emitting diode elements as a light source.

BACKGROUND ART

For example, Patent Document 1 discloses an illumination apparatus which is of a chip-on-a-board (COB) type. This kind of illumination apparatus includes a resin substrate having a white surface, a plurality of light emitting diode strings, a reflector, and a sealing member.

The light emitting diode strings linearly extend along the surface of the resin substrate and are arranged parallel to each other at intervals in a direction orthogonal to a direction along which each light emitting diode string extends. The reflector is bonded to the surface of the resin substrate to surround the light emitting diode strings. The sealing member is made of a transparent silicone resin having a fluorescent material mixed therein. A region surrounded by the reflector to seal the light emitting diode strings is filled with the sealing member.

Each of the light emitting diode strings includes a plurality of light emitting diode elements. The light emitting diode elements are aligned at intervals. Each light emitting diode element has a pair of element electrodes and is bonded to the surface of the resin substrate by using a die bond material.

The light emitting diode elements adjacent to each other in the direction along which the light emitting diode string extends are electrically connected through a bonding wire. One end of the bonding wire is connected to the element electrode of one light emitting diode element in the light emitting diode elements adjacent to each other. The other end of the bonding wire is connected to the element electrode of the other light emitting diode element. Therefore, the light emitting diode string has a configuration that the light emitting diode elements are connected in series.

According to a conventional illumination apparatus, the element electrodes of each light emitting diode element are aligned in the direction along which the light emitting diode string extends. Therefore, when the light emitting diode string is seen in a plan view, the bonding wires are wired in a straight line in the direction along which the light emitting diode string extends.

Furthermore, all the light emitting diode strings have the same entire length. When the light emitting diode strings are arranged parallel to each other at intervals, many light emitting diode elements are regularly arranged in a matrix form in the substantially entire region surrounded by the reflector.

According to the thus configured illumination apparatus, relay bonding pads to which the bonding wires are bonded are not required between the light emitting diode elements adjacent to each other in the direction along which the light emitting diode string extends. Therefore, a pitch between the light emitting diode elements adjacent to each other can be reduced, which is suitable for high dense arrangement of many light emitting diode elements. Moreover, if the pitch between the light emitting diode elements adjacent to each other is narrowed, a length of the bonding wire cutting across the light emitting diode elements adjacent to each other can be reduced when the light emitting diode string is seen in a plan view. As a result, deformation of the bonding wire caused because of a weight of the sealing member can be suppressed.

PRIOR ART DOCUMENT

Patent Document

Pat. Document 1: Jpn. Pat. Appln KOKAI Publication No. 2008-277561

SUMMARY OF THE INVENTION

Problems to be Solved

The light emitting diode element generally has a rectangular shape when seen in a plan view. A pair of element electrodes of the light emitting diode element are aligned at an interval in the longitudinal direction of the light emitting diode element. Therefore, in the illumination apparatus described in Patent Literature 1, when a space in the direction along which the light emitting diode string extends is limited, there occurs the following problem.

Since the light emitting diode elements are aligned in the light emitting diode string, the light emitting diode elements adjacent to each other have side surfaces facing each other. An interval between the side surfaces of the light emitting diode elements adjacent to each other is narrower than the pitch between the light emitting diode elements adjacent to each other.

Therefore, at the time of arranging the light emitting diode elements, when a size of the interval between the side surfaces of the light emitting diodes adjacent to each other is prioritized, the number of the light emitting diode elements that can be arranged in the limited space is reduced. Accordingly, this priority is not preferable when highly densely arranging the light emitting diode elements.

On the other hand, at the time of arranging the light emitting diode elements, when the number of the light emitting diode elements that should be arranged in the limited space is prioritized, the interval between the side surfaces of the light emitting diode elements adjacent to each other becomes very narrow. Therefore, the sealing member that seals the light emitting diode elements hardly enters the space between the light emitting diode elements adjacent to each other, and air bubbles are unavoidably produced between the light emitting diode elements adjacent to each other. The air bubbles remain as voids in the sealing member. Since the voids scatter light when the light enters from the light emitting diode elements, and they may disarrange appropriate light distribution in some cases.

Moreover, even under conditions for highly densely arranging the light emitting diode elements, the bonding wires cutting across the light emitting diode elements adjacent to each other are wired on the straight in the direction along which the light emitting diode string extends when the light emitting diode string is seen in the plan view. Therefore, the length of the bonding wire is too short. When the bonding wire is too short, the workability when bonding the bonding wire to the element electrode is deteriorated, which is not preferable for manufacture of the light emitting diode strings. Additionally, since the extremely short bonding wire is hardly deformed, handling of the bonding wire is poor.

Further, a reduction in the strength of an end portion of the bonding wire bonded to the element electrode due to recrystallization cannot be helped. Therefore, when the sealing member that hermetically seals the bonding wire thermally expands or contracts because of thermal influence of the light emitting diode elements, expansion/contract of the sealing member repeatedly functions as stress on the bonding wire. Thus, the bonding wire may be possibly bent at the end portion with low strength.

It is an object of the present invention to provide a light emitting module that can excellently maintain the workability and improve manufacturing efficiency even under conditions for highly densely arranging light emitting diode elements.

It is another object of the present invention to provide an illumination apparatus comprising the light emitting module having the improved manufacturing efficiency as a light source.

Means for Solving the Problem

To achieve the object, a light emitting module according to the present invention defined in claim 1 comprises: a module substrate; a light emitting diode string; and a sealing member. The light emitting diode string comprises a plurality of light emitting diode elements, each of the light emitting diode elements has an anode element electrode and a cathode element electrode, and have a rectangular shape that extend in a direction along which the element electrodes are aligned, and a plurality of bonding wires that electrically connect the light emitting diode elements adjacent to each other in series, the light emitting diode elements being fixed to the module substrate. The sealing member has translucency and is laminated on the module substrate to seal the light emitting diode string.

The light emitting diode elements are arranged at intervals in a direction crossing the direction along which the element electrodes are aligned, and the element electrodes having the same polarity are aligned to be adjacent to each other in an arrangement direction of the light emitting diode elements between the light emitting diode elements adjacent to each other. Each bonding wire is obliquely wired with respect to the arrangement direction of the light emitting diode elements to connect the element electrodes having different polarities of the light emitting diode elements adjacent to each other.

In the light emitting module according to claim 1, the light emitting diode element means a semiconductor light emitting element formed of a bare chip. The light emitting diode element has a rectangular shape when seen in a plan view from the direction of the element electrodes, and the element electrodes are aligned parallel to the longitudinal direction of the light emitting diode element.

The module substrate of the light emitting module comprises an insulating layer made of a synthetic resin, glass, or ceramics. The insulating layer may be provided in the form of a single layer or multiple layers. To facilitate radiation properties of the module substrate, a structure that a metal plate is laminated on a back surface of the insulating layer may be adopted.

Although the linear light emitting diode string of the light emitting module is desirable, the light emitting diode string may have bent portions that are bent at a right angle between one end and the other end thereof, for example. A metal fine wire is satisfactory as the bonding wire of the light emitting module, and using a fine wire made of copper (Cu) is desirable.

In the light emitting module according to claim 1, as the sealing member, it is possible to use transparent glass, a transparent silicone resin which is an example of a resin material having translucency, a transparent urethane resin, a transparent acrylic resin, and others.

In the light emitting module according to claim 1, to obtain white light by using the light emitting diode element that emits blue light, a yellow fluorescence substance that is excited by the blue light to emit yellow light can be mixed into the sealing member. Likewise, to obtain white light, by using the light emitting diode element that emits an ultraviolet ray, a red fluorescence substance that is excited by the ultraviolet ray to emit red light, a green fluorescence substance that is excited by the ultraviolet ray to emit green light, and a blue fluorescence substance that is excited by the ultraviolet ray to emit blue light can be mixed into the sealing member. Further, light emitting units using three types of light emitting diode elements that emit red, green, and blue light as one set may be mounted on the module substrate. In this case, since lights emitted from the three types of light emitting diode elements are mixed with each other to emit white light from each light emitting unit, a fluorescence substance does not have to be mixed into the sealing member.

According to the light emitting module defined in claim 1, the light emitting diode elements constituting the light emitting diode string are arranged at intervals in the direction crossing the direction along which one pair of element electrodes are aligned. Therefore, for example, even under conditions that a space in the direction along which the light emitting diode string extends, it is possible to reduce a pitch between the light emitting diode elements adjacent to each other in the direction along which the light emitting diode string extends, thereby aligning many light emitting diode elements in the direction along which the light emitting diode string extends. Therefore, the light emitting diode elements can be highly densely arranged on the module substrate.

Further, in the light emitting module according to claim 1, the element electrodes with the same polarity of the light emitting diode elements are aligned to be adjacent to each other in the alignment direction of the light emitting diode elements. As a result, the bonding wire that connects the element electrodes with the different polarities of the light emitting diode elements adjacent to each other is obliquely wired with respect to the arrangement direction of the light emitting diode elements.

Therefore, it is good enough to supply the light emitting diode elements onto the module substrate in a state that directions of the element electrodes with the same polarity are uniformed. In other words, directions of the light emitting diode elements do not have to be alternately reversed in such a manner that the element electrodes with the different polarities are aligned to be adjacent to each other. This results in improvement in the workability when mounting many light emitting diode elements on the module substrate.

Moreover, when the light emitting module is seen in a plan view, all the bonding wires cutting across the light emitting diode elements are inclined in the same direction. As a result, since the bonding wires are arranged according to a given rule, whether installation of the binding wire has a defect can be readily confirmed.

Additionally, in comparison with an example where each bonding wire is wired on the straight along the arrangement direction of the light emitting diode elements, a length of each bonding wire when seeing the light emitting module in a plan view can be assured. Therefore, a work of bonding the bonding wire to the element electrode can be facilitated.

Further, since the bonding wire is apt to deform, even when the sealing member that covers each bonding wire thermally expands or contracts under the thermal influence of the light emitting diode elements, each bonding wire smoothly deforms to follow the expansion/contraction of the sealing member. Therefore, stress applied to an end portion of the bonding wire bonded to the element electrode can be reduced.

In the light emitting module according to claim 2, each bonding wire protrudes to describe an arc in a direction to get away from the module substrate between the light emitting diode elements adjacent to each other, and a protruding height of a top portion of the bonding wire with respect to the light emitting diode element is specified as 200 to 500 µm.

As the bonding wire bonded to the element electrode, a copper fine wire is generally used. When the copper bonding wire is bonded to the element electrode, the strength of the bonding wire in a region of approximately 100 to 180 µm from the element electrode is reduced because of recrystallization. Therefore, when a protruding height of the bonding wire is lower than 200 µm, the bonding wire has a higher possibility that it cannot resist the stress involved by the expansion/contraction of the sealing member and then bends at the moment the sealing member covering each bonding wire thermally expands or contracts.

On the other hand, the light emitting diode elements and the bonding wires are covered with the sealing member. Therefore, when the protruding height of each bonding wire exceeds 500 µm, the top portion of the each bonding wire protrudes to the outside of the light emitting module from the sealing member, and the bonding wire is unavoidably damaged. Furthermore, since the bonding wire is too long, large stress is produced in the bonding wire when the sealing member thermally expands or contracts, whereby the bonding wire may be possibly disconnected.

Therefore, when the protruding height of the bonding wire is set to fall within the range of 200 to 500 µm, the strength of the bonding wire can be improved to avoid undesirable damage and disconnection of the bonding wire.

Moreover, the protruding height of the bonding wire with respect to the light emitting diode element becomes appropriate, and the space between the light emitting diode elements adjacent to each other can be readily filled with the sealing member. In other words, the bonding wire cutting across the light emitting diode elements adjacent to each other can be prevented from obstructing a flow of the sealing member that is put between the light emitting diode elements. As a result, air bubbles are hardly produced between the light emitting diode elements adjacent to each other, and the air bubbles can be prevented from remaining in the sealing member as voids.

In the light emitting module according to claim 3, the sealing member is made of a resin material. As the resin material, for example, a transparent dimethyl silicone resin having a low flexural modulus can be used. The resin material used for the sealing material is not restricted to the dimethyl silicone resin, and any other translucent resin material having the same properties can be utilized. Since the resin material having the low flexural modulus is rich in flexibility, stress applied to the bonding wire by the sealing member, can be reduced even though the sealing member thermally expands or contracts.

The light emitting module according to claim 4 further comprises: a metal reflective layer which is laminated on the module substrate and has a light reflecting surface; and a translucent die bond material which is interposed between the light emitting diode elements and the light reflecting surface and bonds the light emitting diode elements to the metal reflective layer. The die bond material is made of a resin material having lower gas permeability than that of the sealing member and protrudes around the light emitting diode elements on the metal reflective layer.

In the light emitting module according to claim 4, the light reflecting surface of the metal reflective layer is configured to reflect light emitted from the light emitting diode element and efficiently extract the light. The metal reflective layer has a size that enables installation of the light emitting diode elements thereon. The metal reflective layer may be provided in the form of a single layer using one type of metal material or multiple layers obtained by laminating different types of metals. Additionally, laminating at least one metal reflective layer on the module substrate can suffice.

In the light emitting module according to claim 4, as the resin material constituting the die bond material, using, e.g., a transparent silicone resin having a water vapor transmission rate of 100 cc/m$^2$·day or below is preferable. Further, the die bond material that can bond each of the light emitting diode elements to the metal reflective layer is excellent, and pieces of the die bond material associated with the light emitting diode elements adjacent to each other may be continuous or may be separated from each other. Furthermore, the die bond material may be provided to entirely cover a region where at least the light emitting diode elements are arranged in the light reflecting surface of the metal reflective layer.

According to the light emitting module of claim 4, a major part of heat produced from the light emitting diode elements when the light emitting diode elements emit light is transferred to the metal reflective layer from the light emitting diode elements and widely diffused to every corner of the metal reflective layer. Since the heat diffused to the metal reflective layer is transferred from the metal reflective layer to the module substrate, thermal radiation properties of the light emitting diode elements can be improved.

Furthermore, the metal reflective layer reflects the light of the light emitting diode elements that has entered the light reflecting surface to a light utilizing direction. As a result, light extraction efficiency can be enhanced, thereby profitably and effectively exploiting the light.

According to the light emitting module of claim 4, the die bond material interposed between the light emitting diode elements and the metal reflective layer has lower gas permeability than the sealing member and protrudes around the light emitting diode elements. Therefore, even if, e.g., a corrosive gas permeates the sealing member, the corrosive gas that has permeated the sealing member is hard to reach positions associated with the light emitting diode elements and a region surrounding the periphery of the light emitting diode elements in the metal reflective layer. Therefore, discoloration of the metal reflective layer due to the corrosive gas is suppressed, thereby excellently maintaining light reflection properties of the metal reflective layer.

The die bond material having the low gas permeability unavoidably becomes harder than the sealing member. However, the hard die bond material is apart from each bonding wires of the light emitting diode string. Therefore, even if the die bond material thermally expands or contracts based on a heat cycle, the die bond material does not function as a factor that stresses the bonding wires.

In the light emitting module according to claim 5, the sealing member is made of a softer resin material than the die bond material. If the sealing member is soft, stress applied to the bonding wires by the sealing member can be reduced even though the sealing member thermally expands or contracts based on the heat cycle.

In the light emitting module according to claim 6, the die bond material contains a phenyl silicone component. The phenyl silicone resin has lower gas permeability than, e.g., dimethyl silicone resin. Therefore, the die bond material containing the phenyl silicone component prevents the metal reflective layer from being exposed to a gas that has permeated the sealing member.

In the light emitting module according to claim 7, both the die bond material and the sealing member contain the phenyl silicon component. When the sealing member contains the phenyl silicone component, the gas hardly permeates the sealing member. Furthermore, even if the gas has permeated the sealing member, the die bond material containing the phenyl silicon component can restrict the gas to reach the metal reflective layer.

To achieve the object, an illumination apparatus according to claim 8 comprises a main body and a light emitting module supported by the main body. The light emitting module comprises a module substrate, a light emitting diode string, and a sealing member. The light emitting diode string comprises a plurality of light emitting diode elements, each of the light emitting elements has an anode element electrode and a cathode element electrode, and have a rectangular shape that extend in a direction along which the element electrodes are aligned, and a plurality of bonding wires that electrically connect the light emitting diode elements adjacent to each other in series, the light emitting diode elements being fixed to the module substrate. The sealing member has translucency and is laminated on the module substrate to seal the light emitting diode string.

The light emitting diode elements are arranged at intervals in a direction crossing the direction along which the element electrodes are aligned, and the element electrodes having the same polarity are aligned to be adjacent to each other in an arrangement direction of the light emitting diode elements between the light emitting diode elements adjacent to each other. Each bonding wire is obliquely wired with respect to the arrangement direction of the light emitting diode elements to connect the element electrodes having different polarities of the light emitting diode elements adjacent to each other.

In the illumination apparatus according to claim 9, the main body comprises: a heat sink; and a heat receiving portion thermally connected to the heat sink. The module substrate of the light emitting module is fixed to the heat receiving portion and thermally connected to the heat receiving portion.

According to the illumination apparatus of claim 9, heat of the light emitting diode elements transmitted to the module substrate of the light emitting module is transferred to the heat sink from the module substrate through the heat receiving portion. Therefore, the main body of the illumination apparatus can be utilized to improve the thermal radiation properties of the light emitting module.

Advantages of Invention

According to the light emitting module of claim 1, under the conditions that the space in the direction along which the light emitting diode string extends is limited, the light emitting diode elements can be highly densely arranged on the module substrate. Further, it is good enough to supply the light emitting diode elements onto the module substrate in the state that directions of the element electrodes with the same polarity are uniformed. Therefore, directions of the light emitting diode elements do not have to be alternately reversed, the work of mounting the light emitting diode elements on the module substrate can be facilitated. Furthermore, since the bonding wires are arranged according to a given rule, whether implementation of the bonding wires has a defect can be recognized at first sight. Therefore, the light emitting module manufacturing efficiency can be improved to reduce a cost.

According to the light emitting module of claim 2, strength of the bonding wires can be enhanced to avoid undesired damage and disconnection of the bonding wires. Moreover, voids that scatter light hardly remains in the sealing member put between the light emitting diode elements adjacent to each other, thus obtaining appropriate distribution of light.

According to the light emitting module of claim 3, even if the sealing member thermally expands or contract, stress applied to the bonding wires by the sealing member can be reduced.

According to the light emitting module of claim 4, thermal radiation properties of the light emitting diode elements can be improved to excellently maintain the light emission efficiency of the light emitting diode elements. Additionally, discoloration of the light reflecting surface of the metal reflective layer due to a gas that has permeated the sealing member can be suppressed to excellently maintain light reflection performance of the metal reflective layer, thereby increasing light extraction efficiency.

According to the light emitting module of claim 5, even if the sealing member thermally expands or contract, stress applied to the bonding wires by the sealing member can be alleviated. Therefore, reliability of electrical connection between the bonding wires and the light emitting diode elements can be assured.

According to the light emitting module of claim 6, the gas flowing from the die bond material to the metal reflective layer can be assuredly blocked, thereby avoiding deterioration of the light reflection performance involved by corrosion of the metal reflective layer.

According to the light emitting module of claim 7, since the gas hardly permeate both the sealing member and the die bond material, corrosion and deterioration in the light reflection performance of the metal reflective layer can be assuredly avoided.

According to the illumination apparatus of claim 8, the light emitting module having the improved manufacturing efficiency can be used as a light source, a manufacturing cost of the illumination apparatus can be reduced, and the inexpensive illumination apparatus can be provided.

According to the illumination apparatus of claim 9, the thermal radiation properties of the light emitting module can be improved, and a reduction in light emission efficiency involved by overheating of the light emitting module can be prevented.

BRIEF DESCRIPTION OF DRAWINGS

FIG. 4 is a cross-sectional view of a metal reflective layer laminated on a module substrate in the first embodiment according to the present invention;

FIG. 5 is a plan view of a light emitting diode element used in the first embodiment according to the present invention;

FIG. 6 is a side view of the light emitting diode element used in the first embodiment according to the present invention;

FIG. 7 is a plan view showing a state that a bonding wire connects a pair of light emitting diode elements adjacent to each other in the first embodiment according to the present invention;

FIG. 8 is a plan view showing a state that a bonding wire connects a pair of light emitting diode elements adjacent to each other as a comparative example for revealing the superiority of the first embodiment according to the present invention;

FIG. 11 is a plan view of a light emitting module according to a third embodiment of the present invention;

FIG. 12 is a plan view schematically showing a state that an unhardened die bond material is stamped on a surface of a light reflective layer in the third embodiment according to the present invention;

FIG. 13 is a plan view schematically showing state that light emitting diode elements are bonded to pad portions of the die bond material in the third embodiment according to the present invention;

FIG. 16 is a cross-sectional view of the illumination apparatus according to the fifth embodiment of the present invention.

MODE FOR CARRYING OUT THE INVENTION

A first embodiment according to the present invention will now be described hereinafter with reference to FIG. 1 to FIG. 8.

Figure 1:
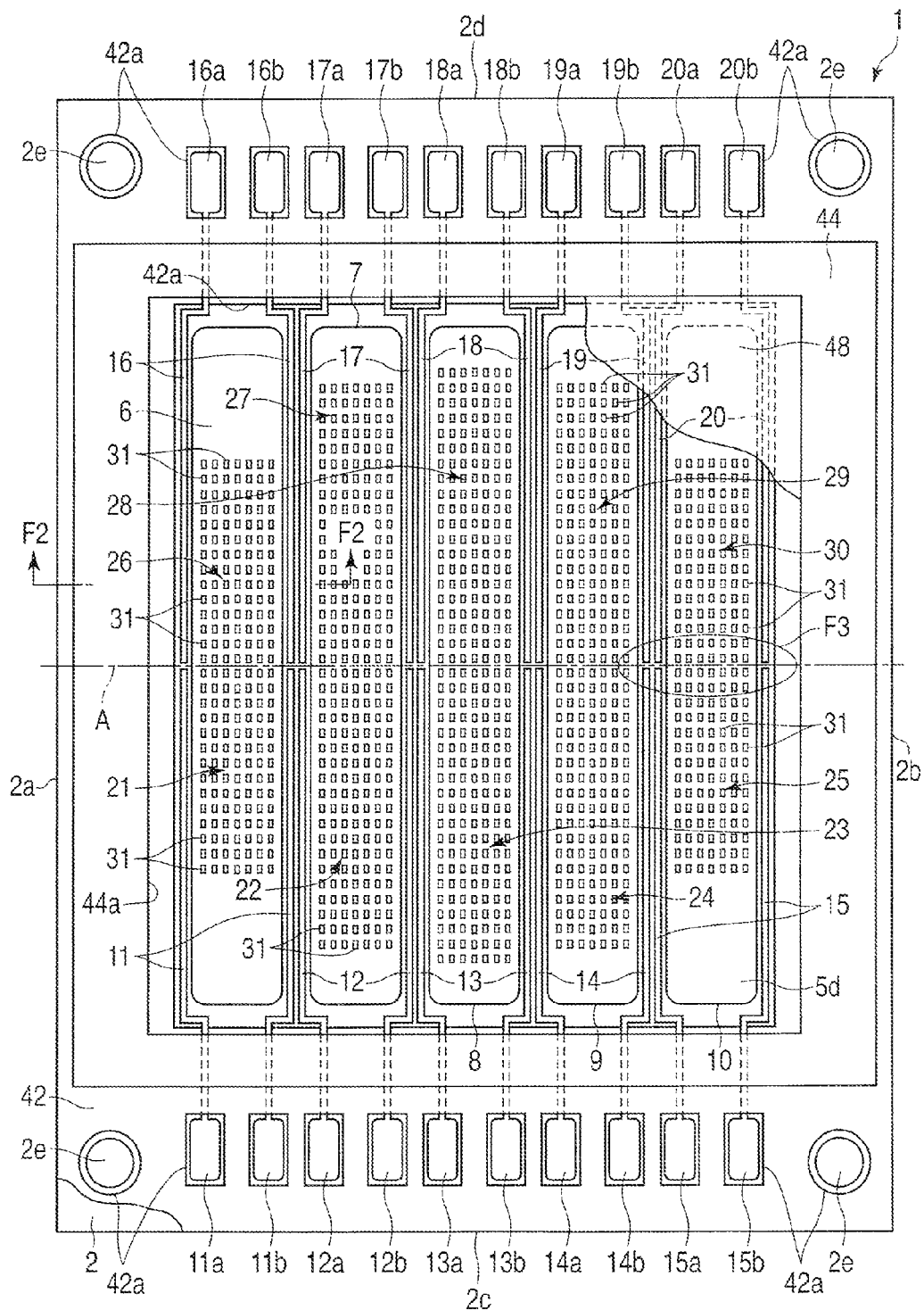
FIG. 1 is a plan view of a light emitting module according to a first embodiment of the present invention.
Figure 2:
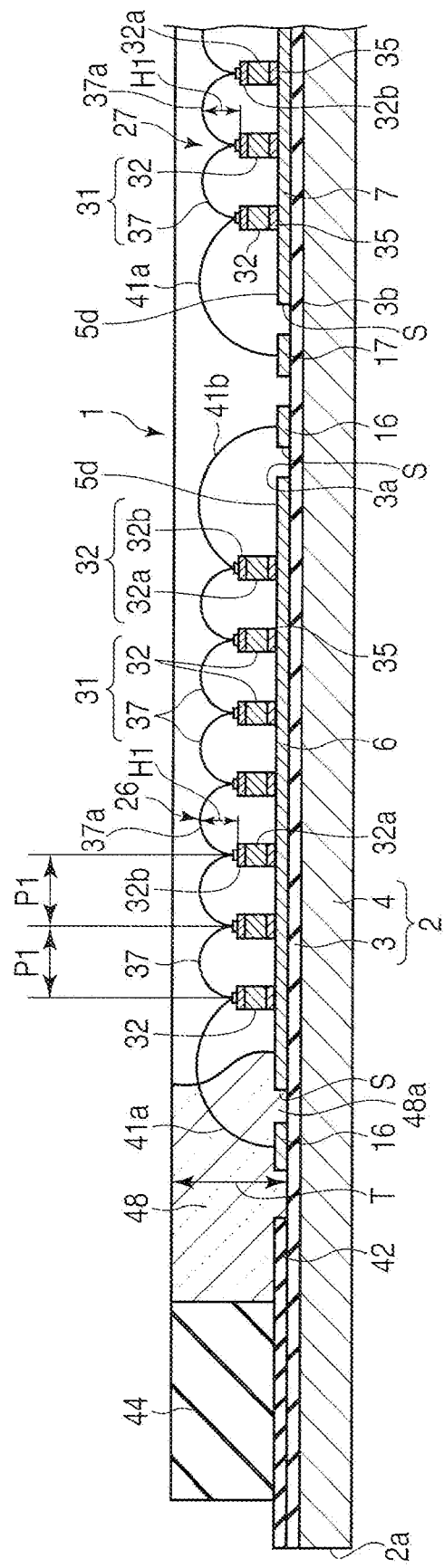
FIG. 2 is a cross-sectional view taken along line F2-F2 in FIG. 1.

FIG. 1 and FIG. 2 disclose a chip-on-a-board (COB) light emitting module 1. The light emitting module 1 is arranged on a focal point of a projector lens group of, e.g., a spotlight and used as a light source of the spotlight.

The light emitting module 1 comprises a module substrate 2 functioning as a base. As shown in FIG. 1, the module substrate 2 is formed into a rectangular shape having a pair of wide sides 2a and 2b and a pair of narrow sides 2c and 2d. The wide sides 2a and 2b are parallel to each other, and the narrow sides 2c and 2d are also parallel to each other. Further, the module substrate 2 has four corner portions. A fitting hole 2e is formed in each corner portion of the module substrate 2.

As shown in FIG. 2, the module substrate 2 is constituted of an insulating layer 3 made of synthetic resin and a metal plate 4. The insulating layer 3 has a first surface 3a and a second surface 3b. The second surface 3b is placed on the opposite side of the first surface 3a. The metal plate 4 is made of, e.g., aluminum or its alloy and laminated on the second surface 3b of the insulating layer 3.

As shown in FIG. 1, first to fifth metal reflective layers 6 to 10 are laminated on the module substrate 2. The first to fifth metal reflective layers 6 to 10 have an elongated rectangular shape extending in a direction parallel to the wide sides 2a and 2b of the module substrate 2 and also have the same size. The first to fifth metal reflective layers 6 to 10 are aligned at intervals parallel to each other in the direction of the narrow sides 2c and 2d of the module substrate 2.

The first to fifth metal reflective layers 6 to 10 have a common configuration, and hence the first metal reflective layer 6 will be explained as a representative. As shown in FIG. 4, the first metal reflective layer 6 is constituted of a copper layer 5a laminated on the first surface 3a of the insulating layer 3, a nickel layer 5b laminated on the copper layer 5a, and a silver layer 5c laminated on the nickel layer 5b. The silver layer 5c constitutes a surface layer of the first metal reflective layer 6 to be exposed to the outside of the first metal reflective layer 6. Therefore, the surface of the first metal reflective layer 6 is a light reflecting surface 5d.

Each of the first to fifth metal reflective layers 6 to 10 is not restricted to the above-described three-layer Configuration, and it may be a single layer of silver or a two-layer configuration having the silver layer laminated on the copper layer. Furthermore, the surface layer of each of the first to fifth metal reflective layers 6 to 10 is not restricted to the silver layer 5c. For example, an aluminum layer, a gold layer, or a nickel layer can be used in place of the silver layer 5c.

As shown in FIG. 1, first to tenth wiring conductors 11 to 20 are laminated on the module substrate 2. Each of the first to tenth wiring conductors 11 to 20 has the same three-layer configuration as that of each of the first to fifth metal reflective layers 6 to 10, and its surface layer is constituted of a silver layer. Each of the first to tenth wiring conductors 11 to 20 may have a single layer or a double layer if at least its surface layer is formed of the silver layer. The first to tenth wiring conductors 11 to 20 are formed by, e.g., etching or plate processing simultaneously with the first to fifth metal reflective layers 6 to 10.

Each of the first to tenth wiring conductors 11 to 20 has a pair of conductor patterns. One conductor pattern is used for an anode, and the other conductor pattern is used for a cathode. The first to fifth wiring conductors 11 to 15 and the sixth to tenth wiring conductors 16 to 20 are line-symmetrically arranged with a center line A of the module substrate 2 running between the narrow sides 2c and 2d of the module substrate 2 at the boundary.

Giving a specific description, the conductor patterns of the first wiring conductor 11 are arranged to be parallel to sandwich the first metal, reflective layer 6 therebetween. The conductor patterns extend along the side edges of the first metal reflective layer 6 in a state that a predetermined insulation distance is assured between each side edge of the first metal reflective layer 6 and each conductor pattern. The conductor patterns of the first wiring conductor 11 have terminal portions 11a and 11b, respectively.

The conductor patterns of the second wiring conductor 12 are arranged parallel to sandwich the second metal reflective layer 7 therebetween. The conductor patterns extend along the side edges of the second metal reflective layer 7 in a state that predetermined insulation distance is assured between each side edge of the second metal reflective layer 7 and each conductor pattern. The conductor patterns of the second wiring conductor 12 have terminal portions 12a and 12b, respectively.

The conductor patterns of the third wiring conductor 13 are arranged parallel to sandwich the third metal reflective layer 8 therebetween. The conductor patterns extend along the side edges of the third metal reflective layer 8 in a state that a predetermined insulation distance is assured between each side edge of the third metal reflective layer 8 and each conductor pattern. The conductor patterns of the third wiring conductor 13 have terminal portions 13a and 13b, respectively.

The conductor patterns of the fourth wiring conductor 14 are arranged parallel to sandwich the fourth metal reflective layer 9 therebetween. The conductor patterns extend along the side edges of the fourth metal reflective layer 9 in a state that a predetermined insulation distance is assured between each side edge of the fourth metal reflective layer 9 and each conductor pattern. The conductor patterns of the fourth wiring conductor 14 have terminal portions 14a and 14b, respectively.

The conductor patterns of the fifth wiring conductor 15 are arranged parallel to sandwich the fifth metal reflective layer 10 therebetween. The conductor patterns extend along the side edges of the fifth metal reflective layer 10 in a state that a predetermined insulation distance is assured between each side edge of the fifth metal reflective layer 10 and each conductor pattern. The conductor patterns of the fifth wiring conductor 15 have terminal portions 15a and 15b, respectively.

The terminal portions 11a to 15a and 11b to 15b of the first to fifth wiring conductors 11 to 15 are placed between one end of each of the first to fifth metal reflective layers 6 to 10 in the longitudinal direction and one narrow side 2c of the module substrate 2 and aligned at intervals in a direction of the narrow side 2c.

The conductor patterns of the sixth wiring conductor 16 are arranged parallel to sandwich the first metal reflective layer 6 therebetween. The conductor patterns extend along the side edges of the first metal reflective layer 6 in a state that a predetermined insulation distance is assured between each side edge of the first metal reflective layer 6 and each conductor pattern. The conductor patterns of the sixth wiring conductor 16 have terminal portions 16a and 16b, respectively.

The conductor patterns of the seventh wiring conductor 17 are arranged parallel to sandwich the second metal reflective layer 7 therebetween. The conductor patterns extend along the side edges of the second metal reflective layer 7 in a state that a predetermined insulation distance is assured between each side edge of the second metal reflective layer 7 and each conductor pattern. The conductor patterns of the seventh wiring conductor 17 have terminal portions 17a and 17b, respectively.

The conductor patterns of the eighth wiring conductor 18 are arranged parallel to sandwich the third metal reflective layer 8 therebetween. The conductor patterns extend along the side edges of the third metal reflective layer 8 in a state that a predetermined insulation distance is assured between each side edge of the third metal reflective layer 8 and each conductor pattern. The conductor patterns of the eighth wiring conductor 18 have terminal portions 18a and 18b, respectively.

The conductor patterns of the ninth wiring conductor 19 are arranged parallel to sandwich the fourth metal reflective layer 9 therebetween. The conductor patterns extend along the side edges of the fourth metal reflective layer 9 in a state that a predetermined insulation distance is assured between each side edge of the fourth metal reflective layer 9 and each conductor pattern. The conductor patterns of the ninth wiring conductor 19 have terminal portions 19a and 19b, respectively.

The conductor patterns of the tenth wiring conductor 20 are arranged parallel to sandwich the fifth metal reflective layer 10 therebetween. The conductor patterns extend along the side edges of the fifth metal reflective layer 10 in a state that a predetermined insulation distance is assured between each side edge of the fifth metal reflective layer 10 and each conductor pattern. The conductor patterns of the tenth wiring conductor 20 have terminal portions 20a and 20b, respectively.

The terminal portions 16a to 20a and 16b to 20b of the sixth to tenth wiring conductors 16 to 20 are placed between the other end of each of the first to fifth metal reflective layers 6 to 10 in the longitudinal direction and the other narrow side 2d of the module substrate 2 and aligned at intervals in a direction of the narrow side 2d.

As shown in FIG. 1 and FIG. 2, the conductor patterns of the first to tenth wiring conductors 11 to 20 and the first to sixth metal reflective layers 6 to 10 are alternately aligned along the direction of the narrow sides 2c and 2d of the module substrate 2 on the first surface 3a of the insulating layer 3 of the module substrate 2. Therefore, the conductor patterns of the first to tenth wiring conductors 11 to 20 and the first to sixth metal reflective layers 6 to 10 constitute convex portions that protrude from the first surface 3a of the module substrate 2. Likewise, gaps formed between the conductor patterns and the first to sixth metal reflective layers 6 to 10 constitute concave portions on the first surface 3a of the module substrate 2.

In other words, the conductor patterns of the first to tenth wiring conductors 11 to 20 and the first to sixth metal reflective layers 6 to 10 form many steps S on the first surface 3a of the module substrate 2 in cooperation with each other.

As shown in FIG. 1, first to fifth light emitting portions 21 to 25 are provided in regions of the first to fifth metal reflective layers 6 to 10 between the ends of the first to fifth metal reflective layers 6 to 10 on one side and the center line A of the module substrate 2, respectively. Likewise, sixth to tenth light emitting portions 26 to 30 are provided in regions of the first to fifth metal reflective layers 6 to 10 between the ends of the first to fifth metal reflective layers 6 to 10 on the other side and the center line A of the module substrate 2, respectively.

According to this embodiment, each of the third light emitting portion 23 and the eighth light emitting portion 28 associated with the third metal reflective layer 8 placed at the center of the module substrate 2 has the largest entire length in the direction along the wide sides 2a and 2b of the module substrate 2. The third light emitting portion 23 and the eighth light emitting portion 28 are line-symmetrically arranged with the center line A of the module substrate 2 at the boundary.

Each of the first light emitting portion 21 and the sixth light emitting portion 26 associated with the first metal reflective layer 6 closest to the wide side 2a of the module substrate 2 and each of the fifth light emitting portion 25 and the tenth light emitting portion 30 associated with the fifth metal reflective layer 10 closest to the wide side 2b of the module substrate 2 have the shortest entire lengths in the direction along the wide sides 2a and 2b of the module substrate 2. The first light emitting portion 21 and the sixth light emitting portion 26 are line-symmetrically arranged with the center line A of the module substrate 2 at the boundary. Likewise, the fifth light emitting portion 25 and the tenth light emitting portion 30 are line-symmetrically arranged with the center line A of the module substrate 2 at the boundary.

Further, each of the second light emitting portion 22 and the seventh light emitting portion 27 associated with the second metal reflective layer 7 and each of the fourth light emitting portion 24 and the ninth light emitting portion 29 associated with the fourth metal reflective layer 9 have entire lengths in the direction along the wide sides 2a and 2b of the module substrate 2, the entire lengths being less than the entire lengths of the third and eighth light emitting portions 23 and 28 and greater than the entire lengths of the first, fifth, sixth, and tenth light emitting portions 21, 25, 26, and 30. The second light emitting portion 22 and the seventh light emitting portion 27 are line-symmetrically arranged with the center line A of the module substrate 2 at the boundary. Likewise, the fourth light emitting portion 24 and the ninth light emitting portion 29 are line-symmetrically arranged with the center line A of the module substrate 2 at the boundary.

Therefore, as shown in FIG. 1, the first to tenth light emitting portions 21 to 30 are divided into a first group having the largest entire length, a second group having the shortest entire, lengths, and a third group having the intermediate entire lengths of the two groups.

Although the first to tenth light emitting portions 21 to 30 have the different entire lengths, they have the same basic configuration. Therefore, in this embodiment, the configuration of the sixth light emitting portion 26 depicted in FIG. 2 will be mainly described as a representative.

The sixth light emitting portion 26 includes a plurality of light emitting diode strings 31. The light emitting diode strings 31 linearly extend in a direction orthogonal to the longitudinal direction of the first metal reflective layer 6 and are aligned parallel to each other at intervals in the longitudinal direction of the first metal reflective layer 6.

Each light emitting diode string 31 has a plurality of light emitting diode elements 32 and a plurality of bonding wires 37. As shown in FIG. 5 and FIG. 6, each light emitting diode element 32 is a bare chip having a substrate 32a and a light emitting layer 32b. The substrate 32a is made of an insulating material having translucency like, e.g., sapphire glass. The light emitting layer 32b is laminated on the substrate 32a and emits, e.g., blue light when energized.

The light emitting diode element 32 has an anode element electrode 33 and a cathode element electrode 34 on the light emitting layer 32b. The light emitting diode element 32 has a rectangular shape when seen in a plan view from the direction of the element electrodes 33 and 34. The element electrodes 33 and 34 are aligned at intervals in the longitudinal direction of the light emitting diode element 32.

The light emitting diode elements 32 are aligned on the light reflecting surface 5d of the first metal reflective layer 6 along the direction orthogonal to the longitudinal direction of the first metal reflective layer 6. In other words, the light emitting diode elements 32 are aligned to cut across the first metal reflective layer 6 in the width direction.

Further, the light emitting diode elements 32 are aligned with a predetermined pitch P1 in the direction orthogonal to the longitudinal direction of the first metal reflective layer 6 in a posture that the direction along which the two element electrodes 33 and 34 are aligned coincides with the longitudinal direction of the first metal reflective layer 6. The pitch P1 between the light emitting diode elements 32 adjacent to each other is, e.g., 0.75 mm.

As shown in FIG. 7, each light emitting diode element 32 has a first side surface 32c and a second side surface 32d along the longitudinal direction thereof. The second side surface 32d is placed on the opposite side of the first side surface 32c. The first side surfaces 32c of the two light emitting diode elements 32 adjacent to each other in the direction that the light emitting diode string 31 extends are apart from each other and parallel.

Reference character B1 in FIG. 7 denotes an interval between the first side surfaces 32c of the two light emitting diode elements 32 adjacent to each other, and reference character C1 designates an interval between the second side surfaces 32d of the two light emitting diode elements 32 adjacent to each other. The interval B1 is smaller than the pitch P1 between the light emitting diode elements 32 adjacent to each other. The interval C1 is larger than the pitch P1 between the light emitting diode elements 32 adjacent to each other.

Furthermore, the light emitting diode elements 32 are aligned in such a manner that their anode element electrodes 33 and cathode element electrodes 34 are adjacent to each other along the alignment direction of the light emitting diode elements 32.

Specifically, the element electrode 33 of each light emitting diode element 32 is placed on the light emitting diode element 32 to be closer to the narrow side 2d of the module substrate 2. The element electrode 34 of each light emitting diode element 32 is placed on the light emitting diode element 32 to be closer to the narrow side 2c of the module substrate 2.

Figure 3:
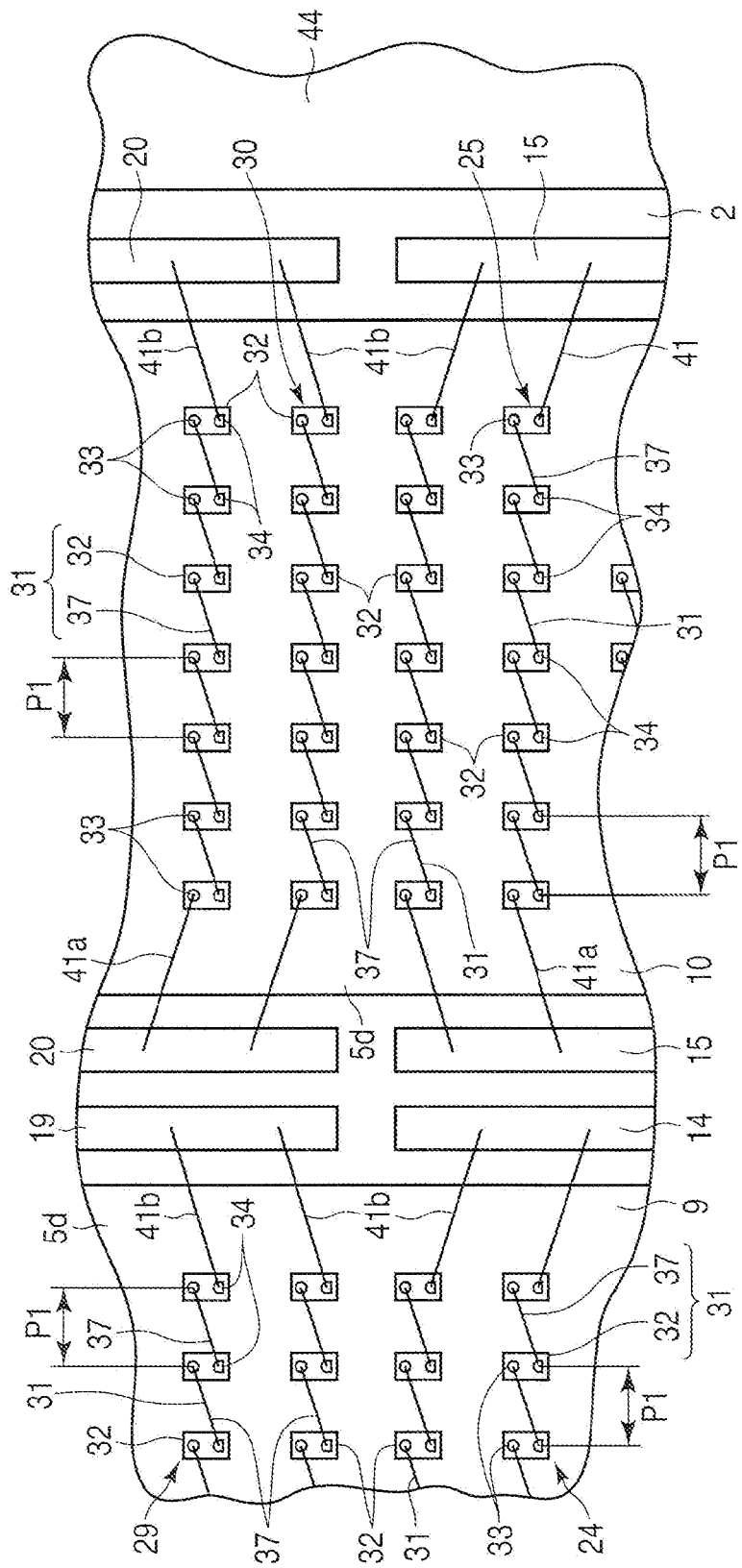
FIG. 3 is a plan view of the light emitting module while enlarging a part indicated by F3 in FIG. 1.

As a result, as best seen in FIG. 3, in each light emitting diode string 31, the anode element electrodes 33 and the cathode element electrodes 34 are aligned along the alignment direction of the light emitting diode elements 32.

The light emitting diode elements 32 constituting the light emitting diode string 31 are bonded to the light reflecting surfaces 5d of the first to fifth metal reflective layers 6 to 10 by using pieces of a die bond material 35. As the die bond material 35, a silicone resin having translucency is used.

The light emitting diode strings 31 constituting the first to tenth light emitting portions 21 to 30 are aligned at intervals in the direction orthogonal to the direction along which each light emitting diode string 31 extends. Moreover, each of the light emitting diode strings 31 has the same number of light emitting diode elements 32, and these light emitting diode elements 32 are aligned at intervals in the direction along which each light emitting diode string 31 extends.

As a result, when the light emitting module 1 is seen in a plan view as depicted in FIG. 1, many light emitting diode elements 32 of the first to tenth light emitting portions 21 to 30 are regularly aligned in the matrix form on the module substrate 2.

As shown in FIG. 2 and FIG. 3, the bonding wire 37 electrically connects the light emitting diode elements 32 that are adjacent to each other in the direction along which the light emitting diode string 31 extends. As the bonding wire 37, for example, a gold fine wire is used. One end of each bonding wire 37 is bonded to the anode element electrode 33 of one light emitting diode element 32 of the two light emitting diode elements 32 adjacent to each other. The other end of each bonding wire 37 is bonded to the cathode element electrode 34 of the other light emitting diode element 32.

In other words, each bonding wire 37 cuts across the light emitting diode elements 32 adjacent to each other to connect the element electrodes 33 and 34 with different polarities of the light emitting diode elements 32 adjacent to each other.

As a result, the light emitting diode elements 32 are electrically connected in series in accordance with each light emitting diode string 31. The bonding wires 37 of the light emitting diode string 31 are obliquely wired with respect to the alignment direction of the light emitting diode elements 32 when seeing the light emitting diode string 31 in a plan view. The bonding wires 37 have the same direction of tilt. Reference character L1 in FIG. 7 denotes a length of the bonding wire 37 when seeing the light emitting diode string 31, in a plan view. The length L1 of the bonding wire 37 is greater than the pitch P1 between the light emitting diode elements 32 adjacent to each other.

Moreover, as shown in FIG. 2, the bonding wire 37 protrudes to describe an arc in a direction to get away from the module substrate 2 between the light emitting diode elements 32 adjacent to each other. A protruding height H1 of a top portion 37a of the bonding wire 37 with respect to the light emitting diode element 32 is defined to fall within the range of 200 to 500 μm.

As shown in FIG. 3 of the fifth and tenth light emitting portions 25 and 30 as representatives, each of the light emitting diode strings 31 is electrically connected to the conductor patterns of the fifth and tenth wiring conductors 15 and 20 through a pair of end bonding wires 41a and 41b.

As the end bonding wires 41a and 41b, for example, gold fine wires are utilized. The one end bonding wire 41a electrically connects the anode element electrode 33 of the light emitting diode element 32 placed at one end of each light emitting diode string 31 to one conductor pattern. The other end bonding wire 41b electrically connects the cathode element electrode 34 of the light emitting diode element 32 placed at the other end of each light emitting diode string 31 to the other conductor pattern. Each of the end bonding wires 41a and 41b is installed to protrude in an arc shape in the direction to get away from the module substrate 2.

As a result, for example, in the fifth light emitting portion 25, the light emitting diode strings 31 are electrically connected to the conductor patterns of the fifth wiring conductor 15 in parallel. This connection relationship is likewise applied to the other light emitting portions 21 to 24 and 26 to 30.

As shown in FIG. 1 and FIG. 2, a protective layer 42 is laminated on an outer peripheral portion of the first surface 3a of the insulating layer 3. The protective layer 42 is a resist layer having electrical insulating properties and surrounds the first to fifth metal reflective layers 6 to 10. The protective layer 42 has a plurality of through holes 42a from which the fitting holes 2e and the terminal portions 11a to 20a and 11b to 20b are exposed.

A frame body 44 is fixed on the protective layer 42. The frame body 44 is made of an insulating material such as a synthetic resin. The frame body 44 collectively surrounds the first to fifth metal reflective layers 6 to 10, the first to tenth wiring conductors 11 to 20, the first to tenth light emitting portions 21 to 30, the bonding wires 37, and the end bonding wires 41a and 41b.

As shown in FIG. 1 and FIG. 2, a region surrounded by the frame body 44 is filled with a sealing member 48. The sealing member 48 is made of a resin material having optical transparency. In this embodiment, a transparent dimethyl silicone resin is used. The sealing member 48 seals the first to fifth metal reflective layers 6 to 10, the conductor patterns of the first to tenth wiring conductors 11 to 20, the first to tenth light emitting portions 21 to 30, the bonding wires 37, and the end bonding wires 41a and 41b on the module substrate 2. Therefore, the sealing member 48 is continuously laminated on the first to fifth metal reflective layers 6 to 10 and the module substrate 2. A thickness T of the sealing member 48 is, e.g., 1 mm.

The sealing member 48 is injected in a liquid form into the region surrounded by the frame body 44. The sealing member 48 is hardened when heated. As partially shown in FIG. 2, a bottom portion 48a of the hardened sealing member 48 enters the steps S formed on the first surface 3a of the module substrate 2 by the first to sixth metal reflective layers 6 to 10 and the conductor patterns, thereby filling the steps S. As a result, the hardened sealing member 48 is bonded to the insulating layer 3 of the module substrate 2, the first to sixth metal reflective layers 6 to 10, the conductor patterns of the first to tenth wiring conductors 11 to 20, and the protective layer 42, thereby continuously covering these elements.

According to such a configuration, a conformation that the bottom portion 48a of the sealing member 48 has dug into the steps S on the module substrate 2 can be provided, and the bottom portion 48a of the sealing member 48 can thereby function as an anchor for the module substrate 2.

Therefore, even if adhesiveness between the first to fifth metal reflective layers 6 to 10 laminated on the module substrate 2 and the sealing member 48 is poor, bonding strength between the first to fifth metal reflective layers 6 to 10 and the sealing member 48 can be complemented by the anchoring function of the sealing member 48. Therefore, even if the sealing member 48 thermally expands or contracts under the thermal influence of the light emitting diode elements 32, the sealing member 48 is hardly delaminated from the module substrate 2.

Furthermore, when the sealing member 48 thermally expands or contracts in the direction crossing the direction along which the first to fifth metal reflective layers 6 to 10 and the conductor patterns of the first to tenth wiring conductors 11 to 20 extend, an engagement portion between the bottom portion 48a of the sealing member 48 and each step S resists against the expansion/contraction of the sealing member 48. Therefore, the influence of the expansion/contraction of the sealing member 48 on the frame body 44 surrounding the sealing member 48 can be eased. Therefore, stress that functions between the frame body 44 and the sealing member 48 can be reduced, and the bonding strength of the sealing member 48 with respect to the module substrate 2 can be improved, which is preferable.

According to the light emitting module 1 of this embodiment, a fluorescent material is mixed in the sealing member 48. The fluorescent material is uniformly dispersed in the sealing member 48. As the fluorescent material, there is adopted a yellow fluorescent material that is excited by blue light emitted by the light emitting diode elements 32 to emit yellow light.

The fluorescent material mixed in the sealing member 48 is not restricted to the yellow fluorescent body. For example, to improve color rendering properties of light exhibited by the light emitting diode elements 32, a red fluorescent material that is excited by blue light to emit red light or a green fluorescent material that emits green light may be added to the sealing member 48.

According to the thus configured COB-type light emitting module 1, the light emitting diode elements 32 have a rectangular shape that is long in the direction along which their element electrodes 33 and 34 are aligned. The light emitting diode elements 32 are aligned in the direction orthogonal to the longitudinal direction with the predetermined pitch P1. Therefore, even under conditions that the space parallel to the alignment direction of the light emitting diode elements 32 is limited, many light emitting diode elements 32 can be aligned in the direction along which the light emitting diode strings 31 can extend. Therefore, the light emitting diode elements 32 can be highly densely arranged on the module substrate 2.

Giving a specific description, FIG. 8 shows a comparative example for this embodiment. In this comparative example, the two light emitting diode elements 32 are aligned at intervals in the longitudinal direction. Moreover, the bonding wire 37 that connects the element electrodes 33 and 34 of the light emitting diode elements 32 adjacent to each other is linearly wired in the direction along which the light emitting diode elements 32 are aligned. In this comparative example, both a size of the light emitting diode element 32 and an interval B1 between opposed side surfaces 32e of the light emitting diode elements 32 adjacent to each other are equal to those in this embodiment depicted in FIG. 7.

As obvious from the comparison between FIG. 7 and FIG. 8, the pitch P1 between the light emitting diode elements 32 in this embodiment is smaller than a pitch P2 between the light emitting diode elements 32 in the comparative example. Additionally, the interval C1 between the second side surfaces 32d of the light Omitting diode elements 32 in this embodiment is smaller than an interval C2 in the comparative example associated with the interval C1. Therefore, according to this embodiment, more light emitting diode elements 32 than those in the comparative example can be highly densely arranged.

Further, when arranging the light emitting diode elements 32, when the number of the light emitting diode elements 32 that should be arranged in the limited space is prioritized, the interval B1 between the side surfaces 32e of the light emitting diode elements 32 adjacent to each other is extremely narrowed in the comparative example where the longitudinal direction of each light emitting diode element 32 coincides with the alignment direction of the light emitting diode elements 32. Therefore, the sealing member 48 hardly enters the space between the light emitting diode elements 32 adjacent to each other.

As a result, a probability that air bubbles are produced between the light emitting diode elements 32 adjacent to each other is increased, and the air bubbles remain as voids in the hardened sealing member 48. Since the voids scatter light that has entered the sealing member 48 from the light emitting diode elements 32, appropriate distribution of light cannot be obtained.

On the other hand, according to this embodiment, when the number of the light emitting diode elements 32 arranged in the limited space is the same as that in the comparative example, the interval B1 between the first side surfaces 32c of the light emitting diode elements 32 adjacent to each other becomes larger than that in the comparative example. Therefore, the sealing member 48 smoothly enters the space between the light emitting diode elements 32 adjacent to each other, and the air bubbles are hardly produced between the light emitting diode elements 32. Accordingly, the voids that scatter the light can be prevented from remaining in the sealing member 48, thus obtaining the appropriate distribution of light.

According to this embodiment, when the light emitting diode strings 31 are seen in a plan view, the bonding wires 37 are obliquely wired with respect to the arrangement direction of the light emitting diode elements 32. Therefore, the length L1 of the bonding wire 37 shown in FIG. 7 can be assured to be greater than the length L2 of the bonding wire 37 in the comparative example depicted in FIG. 8. As a result, drawing the bonding wires 37 can be facilitated, and an operation of bonding the bonding wires 37 to the element electrodes 33 and 34 can be easily performed.

Further, if each bonding wire 37 is long, the bonding wire 37 is apt to deform. Therefore, for example, even if the sealing member 48 that covers the bonding wires 37 is thermally expands or contracts under the thermal influence of the light emitting diode elements 32, the bonding wires 37 smoothly deform to follow the expansion/contraction of the sealing member 48.

Therefore, stress applied to the end portions of the bonding wires 37 bonded to the element electrodes 33 and 34 can be reduced. As a result, the reliability of connection between the bonding wires 37 and the element electrodes 33 and 34 of the light emitting diode elements 32 can be enhanced, thus improving the durability of the light emitting module 1.

In the COB-type light emitting module 1, a voltage is applied to the first to tenth light emitting portions 21 to 30 through the end portions 11a to 20a and 11b to 20b of the first to tenth wiring conductors 11 to 20. As a result, the light emitting diode elements 32 of the first to tenth light emitting portions 21 to 30 concurrently emit light. Blue light emitted from the light emitting diode elements 32 enters the sealing member 48. A part of the blue light that has entered the sealing member 48 is absorbed in the yellow fluorescent material dispersed in the sealing member 48. The remaining blue light is radiated to the outside of the light emitting module 1 through the sealing member 48 without striking the yellow fluorescent material.

The yellow fluorescent material that has absorbed the blue light is excited to mainly produce yellow light. The yellow light is radiated to the outside of the light emitting module 1 through the sealing member 48. As a result, the yellow light and the blue light are mixed to produce white light, and the white light is used for illumination.

A part of light that travels toward the module substrate 2 from the light emitting layers 32b of the light emitting diode elements 32 strikes the silver layers 5c of the first to fifth metal reflective layers 6 to 10 through the substrates 32a and the die bond materials 35. Furthermore, remaining light that travels toward the module substrate 2 from the light emitting layers 32b directly strikes the silver layers 5c of the first to fifth metal reflective layers 6 to 10 without being transmitted through the substrates 32a and the die bond materials 35.

Therefore, much of the light traveling from the light emitting diode elements 32 to the module substrate 2 is reflected in a light utilizing direction by the silver layers 5c of the first to fifth metal reflective layers 6 to 10. Therefore, the light emitted from the light emitting diode elements 32 can be efficiently extracted the outside of the light emitting module 1.

In the light emitting module 1 according to this embodiment, the first to tenth light emitting portions 21 to 30 have the same width. Further, the respective light emitting diode strings 31 constituting the first to tenth light emitting portions 21 to 30 have the same number of the light emitting diode elements 32 connected in series. Therefore, the equivalent voltage can be applied to the light emitting diode strings 31 of the first to tenth light emitting portions 21 to 30, thus suppressing a variation in emission intensity of the light emitting diode elements 32.

According to the light emitting module 1 of this embodiment, as shown in FIG. 1, the third and eighth light emitting portions 23 and 28 placed at the center of the module substrate 2 have the greatest entire length, the entire lengths of the second light emitting portion 22 and the fourth light emitting portion 24 that are adjacent to the third light emitting portion 23 are less than that of the third light emitting portion 23, and the entire lengths of the seventh light emitting portion 27 and the ninth light emitting portion 29 that are adjacent to the eighth light emitting portion 28 are less than that of the eighth light emitting portion 28. Further, the entire length of the first light emitting portion 21 adjacent to the second light emitting portion 22 is less than the second light emitting portion 22, and the entire length of the sixth light emitting portion 26 adjacent to the seventh light emitting portion 27 is less than the seventh light emitting portion 27. Furthermore, the entire length of the fifth light emitting portion 25 adjacent to the fourth light emitting portion 24 is less than that of the fourth light emitting portion 24, and the entire length of the tenth light emitting portion 30 adjacent to the ninth light emitting portion 29 is less than that of the ninth light emitting portion 29.

In other words, the entire lengths of the first to tenth light emitting portions 21 to 30 are reduced as getting closer to the wide sides 2a and 2b of the module substrate 2 from the center of the module substrate 2. Therefore, when the light emitting module 1 is seen in a plan view as shown in FIG. 1, a light emitting region which is a combination of the first to tenth light emitting portions 21 to 30 can have a shape similar to a circle.

Therefore, for example, when the light emitting module 1 is a light source of a spotlight, a light distribution pattern projected onto a light irradiation region from the spot light can have a shape similar to a circle.

In the light emitting module 1 according to this embodiment, the light emitting diode strings 31 of the first to tenth light emitting portions 21 to 30 are connected to the conductor patterns of the first to tenth wiring conductors 11 to 20 in parallel. Therefore, even if a specific light emitting diode string 31 cannot emit light, the other light emitting diode strings 31 continue light emission. Therefore, the light emission of the first to tenth light emitting portions 21 to 30 is not stopped.

Moreover, the light emitting module 1 has the first to tenth light emitting portions 21 to 30 that are distributed to be line-symmetric with the center line A of the module substrate 2 at the boundary, and an energization system for the first to tenth light emitting portions 21 to 30 is independent. Therefore, for example, even if the light emission of the first light emitting portion 21 is stopped, the remaining second to tenth light emitting portions 22 to 30 continue the light emission. Therefore, the entire light emission of the light emitting module 1 is not stopped.

On the other hand, the light emitting diode elements 32 produce heat at the time of light emission. The heat produced by the light emitting diode elements 32 is transferred to a non-illustrated heat sink from the insulating layer 3 of the module substrate 2 via the metal plate 4 and discharged to the outside of the light emitting module 1 via this heat sink.

The light emitting diode elements 32 are thermally connected to the silver layers 5c of the first to fifth metal reflective layers 6 to 10 through the die bond materials 35. As a result, the first to fifth metal reflective layers 6 to 10 function as heat spreaders, whereby the heat of the light emitting diode elements 32 are dispersed to every corner of the first to fifth metal reflective layers 6 to 10.

Therefore, the heat of the light emitting diode elements 32 can be conducted the module substrate 2 in a state that this heat is extensively dispersed. Therefore, thermal radiation properties of the light emitting diode elements 32 can be enhanced, and light emission efficiency of the light emitting diode elements 32 can be excellently maintained.

According to the light emitting module 1 of the first embodiment of the present invention, the light emitting diode elements 32 are arranged in such a manner that the element electrodes 33 or 34 having the same polarity are arranged to be adjacent to each other in the alignment direction of the light emitting diode elements 32. As a result, the bonding wires 37 that connect the element electrodes 33 and 34 of the light emitting diode elements 32 adjacent to each other are obliquely wired with respect to the arrangement direction of the light emitting diode elements 32.

Therefore, it is satisfactory to supply the light emitting diode elements 32 onto the module substrate 2 in a state that the directions of the element electrodes 33 or 34 having the same polarity are uniformed. In other words, directions of the light emitting diode elements 32 do not have to be alternately reversed in such a manner that the element electrodes 33 or 34 having different polarities are arranged to be adjacent to each other. As a result, the operation of mounting many light emitting diode elements 32 on the module substrate 2 can be facilitated, thereby increasing manufacturing efficiency of the light emitting module 1.

Furthermore, when the light emitting module 1 is seen in a plan view, all the bonding wires 37 cutting across the light emitting diode elements 32 are inclined in the same direction. Therefore, the bonding wires 37 are arranged according to a fixed rule, and hence whether installation of the bonding wires 37 has a defect can be confirmed at first sight.

Therefore, the configuration that is advantageous when examining whether the bonding wires 37 are appropriately wired can be obtained, and this point also contributes to improvement in the manufacturing efficiency of the light emitting module 1.

In this embodiment, each bonding wire 37 is constituted of a copper fine wire. When the copper bonding wires 37 are bonded to the element electrodes 33 and 34 of the light emitting diode elements 32, the strength of regions that are approximately 100 to 180 µm from the element electrodes 33 and 34 is reduced because of recrystallization. Since the bonding wires 37 are covered with the sealing member 48, when the sealing member 48 thermally expands or contracts under the thermal influence of the light emitting diode elements 32, the bonding wires 37 cannot resist stress involved by the expansion/contraction of the sealing member 48, and they may be possibly bent or broken.

Whereas, in the first embodiment, each bonding wire 37 protrudes to describe an arc in the direction to get away from the module substrate 2 between the light emitting diode elements 32 adjacent to each other, and the protruding height H1 of the top portion 37a of the bonding wire 37 with respect to the module substrate 2 is defined to fall within the range of 200 to 500 µm.

When the lower limit of the protruding height H1 of the bonding wire 37 is set to 200 µm, the entire length of the bonding wire 37 exceeds a length of each region whose strength is reduced because of the recrystallization. Therefore, the fundamental strength of each bonding wire 37 can be assured.

Moreover, when the upper limit of the protruding height H1 of each bonding wire 37 is set to 500 µm, the top portion 37a of the bonding wire 37 can be assuredly sealed in the sealing member 48 having the thickness T of 1 mm. Therefore, the top portion 37a of the bonding wire 37 does not project to the outside of the sealing member 48, and damage to the bonding wire 37 can be avoided.

In other words, each bonding wire 37 having an appropriate length can be sealed in the sealing member 48 even though the thickness T of the sealing member 48 is set to 1 mm to realize a reduction in thickness of the light emitting module 1. Therefore, even if the sealing member 48 thermally expands/contracts under the thermal influence of the light emitting diode elements 32, large stress can be prevented from being produced in the bonding wires 37. Accordingly, damage to the bonding wires 37 can be avoided, and the reliability of connection between the bonding wires 37 and the light emitting diode elements 32 can be improved.

Moreover, the protruding height H1 of the bonding wires 37 with respect to the light emitting diode elements 32 becomes appropriate, and the bonding wires 37 do not obstruct a flow of the sealing member 48 that fills the space between the light emitting diode elements 32.

As a result, even if the pitch P1 between the light emitting diode elements 32 adjacent to each other is narrow, flowability of the sealing member 48 is maintained between the light emitting diode elements 32, and air bubbles are hard to be produced between the light emitting diode elements 32. Therefore, voids that scatter light can be prevented from remaining in the sealing member 48, thus obtaining the light emitting module 1 having appropriate distribution of light.

The present invention is not restricted to the first embodiment, and it can be modified and carried out in many ways without departing from the gist of the present invention.

For example, the light emitting module is not restricted to a light source of a spotlight, and it can be also applied as, e.g., a light source of a street lighting fixture.

Additionally, in the first embodiment, the light emitting diode elements are bonded to the light reflecting surfaces of the metal reflective layers. However, the metal reflective layers are not necessary constituent elements, the metal reflective layers may be omitted, and the light emitting diode elements may be bonded to the insulating layer of the module element.

Figure 9:
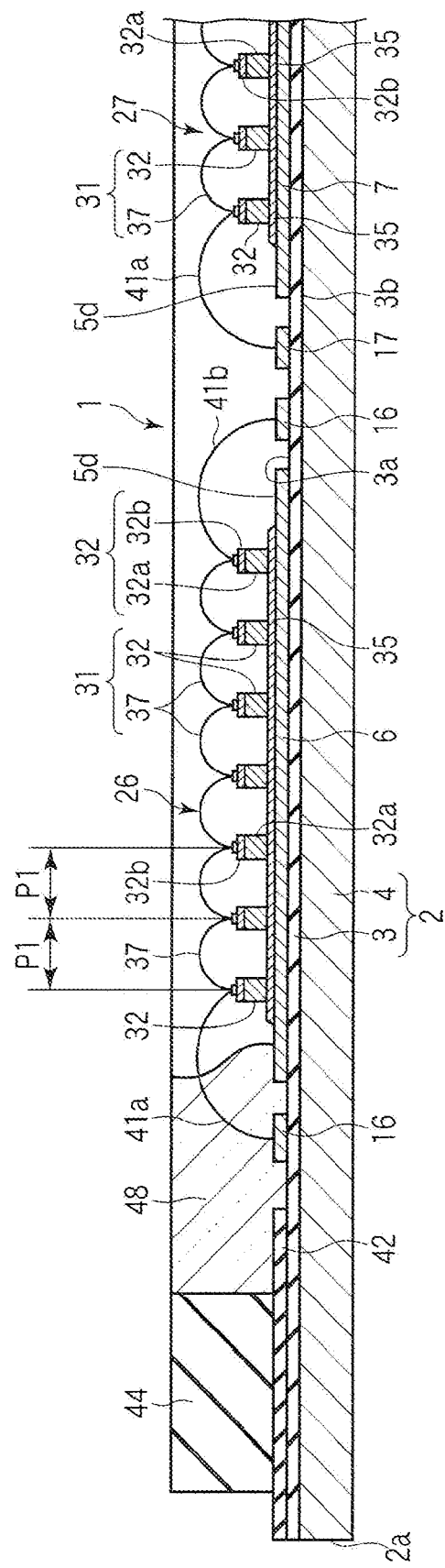
FIG. 9 is a cross-sectional view of a light emitting module according to a second embodiment of the present invention.
Figure 10:
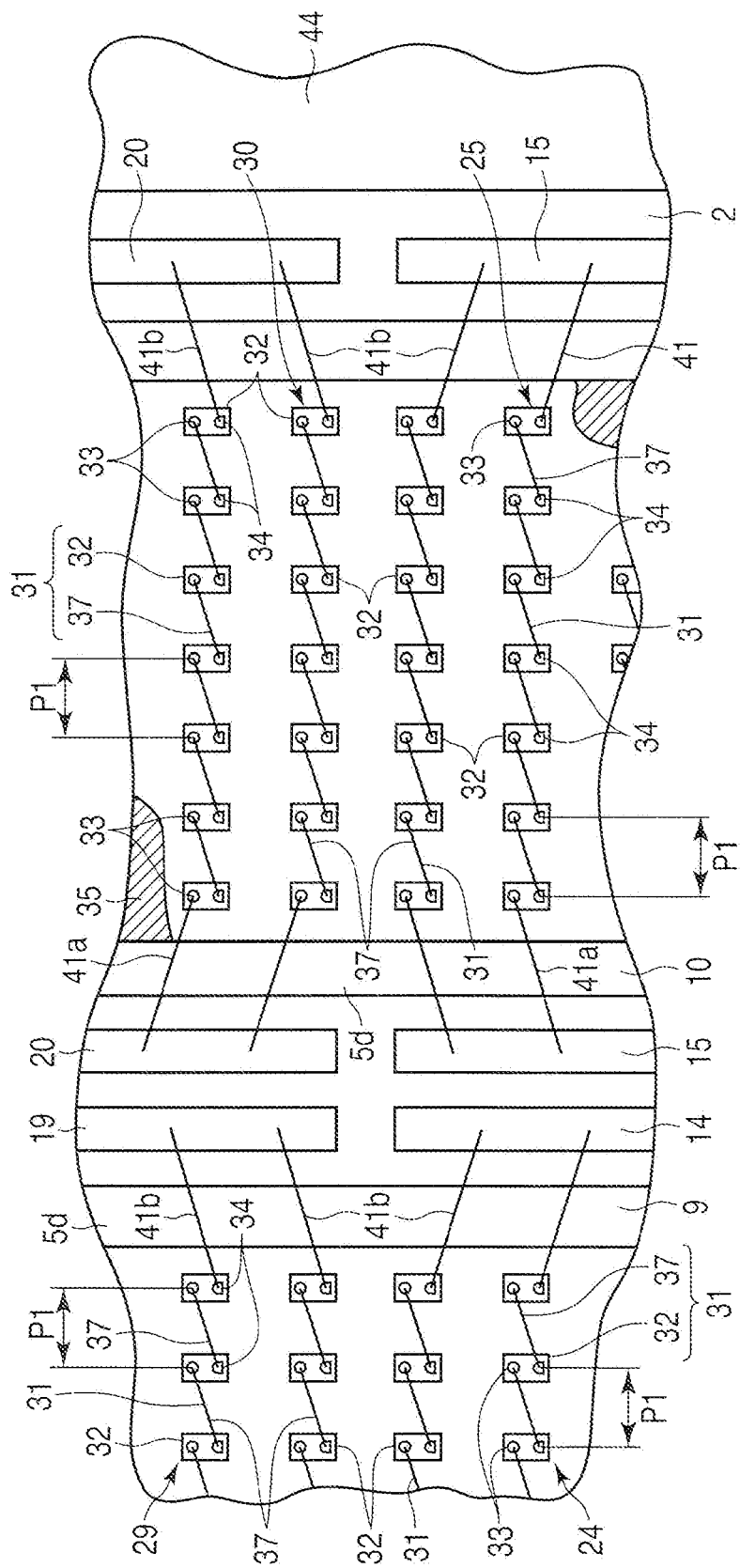
FIG. 10 is a plan view of the light emitting module according to the second embodiment of the present invention.

FIG. 9 and FIG. 10 disclose a second embodiment according to the present invention.

The second embodiment is different from the first embodiment in particulars concerning the die bond materials that bonds the light emitting diode elements to the first to fifth metal reflective layers. A basic configuration of the light emitting modules excluding the die bond material is equal to that of the first embodiment. Therefore, in the second embodiment, like reference numerals denote constituent parts equal to those in the first embodiment, thereby omitting a description thereof.

As shown in FIG. 9 and FIG. 10, die bond materials 35 are applied to cover first to fifth metal reflective layers 6 to 10 and interposed between silver layers 5c and a substrate 32a of respective light emitting diode elements 32. The die bond material 35 covers an entire region of each silver layer 5c excluding side edge portions of this layer.

In other words, the die bond material 35 continuously covers regions associated with the light emitting diode elements 32, each region between the light emitting diode elements 32 adjacent to each other, and each region between light emitting diode strings 31 adjacent to each other in each silver layer 5c. As a result, the die bond material 35 protrudes to the periphery of the light emitting diode elements 32 on each silver layer 5c.

The die bond material 35 is made of a resin material having optical transparency. This resin material contains a phenyl silicone component and has a water vapor transmission rate of, e.g., 100 cc/m$^2$·day. The resin material containing the phenyl silicon component has gas permeability lower than that of a dimethyl silicone resin constituting a sealing member 48.

On the other hand, the dimethyl silicone resin has a flexural modulus lower than that of the resin material containing the phenyl silicon component. Therefore, the sealing member 48 using the dimethyl silicone resin is more flexible than the die bond material 35 containing the phenyl silicone component.

The sealing member 48 of the light emitting module 1 thermally expands or contracts according to a heat cycle based on light emission and stop of the light emission of the light emitting diode elements 32. Whereas, the sealing member 48 is made of the dimethyl silicone resin softer than the die bond material 35. Accordingly, even if the sealing member 48 that covers bonding wires 37 expands or contracts under the thermal influence of the light emitting diode elements 32, stress applied to the bonding wires 37 can be reduced.

Therefore, bonding portions between the bonding wires 37 and element electrodes 33 and 34 of the light emitting diode elements 32 are hardly damaged, and the reliability of electrical connection between the bonding wires 37 and the light emitting diode elements 32 can be maintained.

The flexible sealing member 48 has higher gas permeability than that of the die bond material 35. Therefore, for example, when the light emitting module 1 is used in an environment that a corrosive gas and water vapor are produced in large amounts, the corrosive gas or the water vapor permeates the sealing member 48 and may possibly reach the first to fifth metal reflective layers 6 to 10.

Whereas, according to this embodiment, the die bond materials 35 that bonds the light emitting diode elements 32 to the silver layers 5c of the first to fifth metal reflective layers 6 to 10 are made of the resin material containing the phenyl silicone component having lower gas permeability than that of the sealing member 48. Moreover, the die bond material 35 is applied to the upper side of each silver layer 5c to continuously cover regions associated with the light emitting diode elements 32, each region between the light emitting diode elements 32 adjacent to each other, and each region between the light emitting diode strings 31 adjacent to each other in each silver layer 5c, and it protrudes to the periphery of the light emitting diode elements 32 on the silver layer 5c.

Therefore, when the corrosive gas and the water vapor transmitted through the sealing member 48 reach the die bond material 35, the corrosive gas and the water vapor are blocked by the die bond material 35 at positions associated with the light emitting diode elements 32 and the periphery of the light emitting diode elements 32, whereby the corrosive gas and the water vapor are hard to reach the silver layer 5c.

As a result, it is possible to avoid exposure of the silver layer 5c that reflects light from the light emitting diode elements 32 to the corrosive gas or the water vapor and resultant discoloration. Therefore, light reflection performance of the silver layer 5c constituting a light reflecting surface 5d can be excellently maintained, and light traveling from the light emitting diode elements 32 to the module substrate 2 can be efficiently reflected to a light utilizing direction.

According to such a second embodiment of the present invention, the discoloration of the silver layer 5c can be avoided even in the environment having the large amounts of corrosive gas or water vapor, and the light reflection performance of the first to fifth metal reflective layers 6 to 10 can be excellently maintained.

To verify an effect when using the die bond material 35 having gas permeability lower than that of the sealing member 48, the present inventor conducted the following test.

In this test, the light emitting module 1 was accommodated together with 50 g of sulfur dust in a glass bottle of 100 cc, and it was left at a temperature of 80° C. for 24 hours. When the light emitting module 1 is left at a constant temperature, it is exposed to a sulfuric oxide (Sox) produced by the sulfur dust.

The corrosive gas like the sulfuric oxide permeates the sealing member 48 of the light emitting module 1 and reaches the silver layer 5c forming the light reflecting surface 5d. When the resin material containing the phenyl silicone component having gas permeability lower than that of the sealing member 48 is used as the die bond material 35, the corrosive gas hardly permeates the die bond material 35. If the corrosive gas is blocked by the die bond material 35, the corrosive gas hardly adhere to the silver layer 5c, and a reduction in the lumen maintenance factor of the light emitting module 1 due to the discoloration of the silver layer 5c can be avoided.

In this test, if the lumen maintenance factor of the light emitting module 1 is more than 90% after leaving the light emitting module 1 at a constant temperature for 24 hours, it is determined that the silver layer 5c is not discolored. According to the test conducted by the present inventor, in the light emitting module 1 using the die bond material 35 that contains the phenyl silicone component and has the water vapor transmission rate of 100 cc/m$^2$·day, it was confirmed that the lumen maintenance factor is not lower than 90% even though the light emitting module 1 is left at a constant temperature for 24 hours.

Since the gas permeability of the die bond material 35 is lower than that of the sealing member 48, the die bond material 35 has higher hardness than the sealing member 48. Whereas, the die bond materials 35 are just interposed between the first to fifth metal reflective layers 6 to 10 and the substrates 32a of the light emitting diode elements 32, and their are apart from the bonding wires 37. Therefore, even if the die bond materials 35 expands or contracts based on the heat cycle, the die bond materials 35 does not apply stress to the bonding wires 37.

Although the resin material containing the phenyl silicone component is used as the die bond material in the second embodiment, both the die bond material and the sealing member may contain the phenyl silicone component.

According to this configuration, in comparison with the second embodiment, the corrosive gas or the water vapor hardly permeates the sealing member. As a result, the corrosive gas or the water vapor flowing toward the silver layer can be blocked by both the die bond material and the sealing member, thus assuredly avoiding the discoloration of the silver layer and the reduction in light reflection performance.

FIG. 11 to FIG. 13 disclose a third embodiment according to the present invention.

The third embodiment is different from the first embodiment in particulars concerning the die bond materials that bonds light emitting diode elements to first to fifth metal reflective layers. A basic configuration of a light emitting module excluding the die bond materials is equal to that in the first embodiment. Therefore, in the third embodiment, like reference numerals denote constituent parts equal to those in the first embodiment, thereby omitting a description thereof.

FIG. 11 is a view associated with FIG. 3 of the first embodiment and mainly shows a state of fifth and tenth light emitting portions 25 and 30 bonded to an upper side of a fifth metal reflective layer 10.

As shown in FIG. 11, a die bond material 35 that bonds light emitting diode elements 32 of light emitting diode strings 31 to a light reflecting surface 5d of the fifth metal reflective layer 10 has a plurality of pad portions 51. The pad portion 51 is associated with each of the light emitting diode elements 32 and has a shape larger than that of each light emitting diode element 32.

Giving a specific description, each pad portion 51 has a circular shape. A diameter D of each pad portion 51 is substantially equal to a pitch P1 between the light emitting diode elements 32 adjacent to each other. Furthermore, it is desirable for the diameter. D of each pad portion 51 to be 1.5 to 2.0-fold of a dimension of the light emitting diode element 32 in the longitudinal direction.

The light emitting diode element 32 is placed at the center of the pad portion 51. Therefore, each pad portion 51 does not slightly protrude from the outer edge of a substrate 32a of the light emitting diode element 32, but it positively and greatly protrudes toward the periphery of the light emitting diode element 32.

According to this embodiment, the pad portions 51 that are adjacent to each other in a direction along which the light emitting diode string 31 extends are arranged in such a manner that their outer edge portions are partially continuous. Likewise, the pad portions 51 that are adjacent to each other in a direction orthogonal to the direction along which the light emitting diode string 31 extends are arranged in such a manner that their outer edge portions are partially continuous.

As a result, many gaps G surrounded by the pad portions 51 adjacent to each other are formed on the light reflecting surface 5d of the fifth metal reflective layer 10. At the position of the gap G, the light reflecting surface 5d is not covered with the pad portion 51, and a step is formed between the light reflecting surface 5d and the pad portion 51. In other words, the pad portions 51 form many irregularities on the fifth metal reflective layer 10.

A part of a sealing member 48 provided on a module substrate 2 enters the gaps G to come into contact with the light reflecting surface 5d. Therefore, the sealing member 48 seemingly has made inroads into the irregularities, which is preferable for increasing bonding strength of the sealing member 48 with respect to the module substrate 2.

A procedure of bonding the light emitting diode elements 32 to the upper side of the fifth metal reflective layer 10 will now be described with reference to FIG. 12 and FIG. 13.

A non-illustrated stamp apparatus having circular stamps first prepared. Then, the unhardened die bond material is applied to the light reflecting surface 5d of the fifth metal reflective layer 10 by using the stamp apparatus. As a result, as shown in FIG. 12, circular applied portions 51a are aligned to be adjacent to each other at very small intervals on the light reflecting surface 5d.

Thereafter, as indicated by alternate long and two short dashes lines, each light emitting diode element 32 is supplied to the center of the applied portion 51a. Subsequently, the module substrate 2 is accommodated in an oven to harden the applied portions 51a. As a result, the light emitting diode elements 32 are bonded to the light reflecting surface 5d of the fifth metal reflective layer 10. The procedure of bonding the light emitting diode elements 32 to the light reflecting surface 5d is likewise applied to other metal reflective layers 6 to 9.

When the applied portions 51a are hardened, the viscosity of the die bond material is temporarily reduced. As a result, an outer edge portion of each applied portion 51a flows to spread toward the outside parallel to a radial direction. Consequently, as shown in FIG. 13, the outer edge portions of the applied portions 51a adjacent to each other partially become continuous, and the pad portions 51 are formed on the light reflecting surface 5d. Further, the gaps G surrounded by the pad portions 51 adjacent to each other are formed on the light reflecting surface 5d.

According to such a third embodiment of the present invention, the pad portion 51 of the die bond material 35 greatly protrudes toward the periphery of each light emitting diode element 32. Therefore, a large quantity of light traveling from the light emitting diode elements 32 to the module substrate 2 can be reflected in a light utilizing direction by the pad portions 51.

Additionally, even if a corrosive gas or water vapor that has permeated the sealing member 48 reaches the die bond material 35, the corrosive gas or the water vapor traveling toward silver layers 5c of the first to fifth metal reflective layers 6 to 10 can be blocked by the respective pad portions 51 of the die bond materials 35 at positions associated with the respective light emitting diode elements 32 and the peripheries thereof.

Therefore, discoloration of the silver layers 5c of the first to fifth metal reflective layers 6 to 10 can be avoided, and excellent light reflection performance of the first to fifth metal reflective layers 6 to 10 can be maintained.

On the other hand, at the positions of the gaps G surrounded by the pad portions 51, the light reflecting surface 5d is not covered with the die bond material 35, and the sealing member 48 is directly in contact with the light reflecting surface 5d. Therefore, the corrosive gas or the water vapor that has permeated the sealing member 48 reaches the light reflecting surfaces 5d, whereby the silver layers 5c are discolored.

Accordingly, since the gaps G are apart from the light emitting diode elements 32, even if the silver layers 5c are discolored at the positions of the gaps G, the light reflection performance of the first to fifth metal reflective layers 6 to 10 are not adversely affected. Therefore, light emitted from the light emitting diode elements 32 can be efficiently extracted to the outside of the light emitting module 1.

Figure 14:
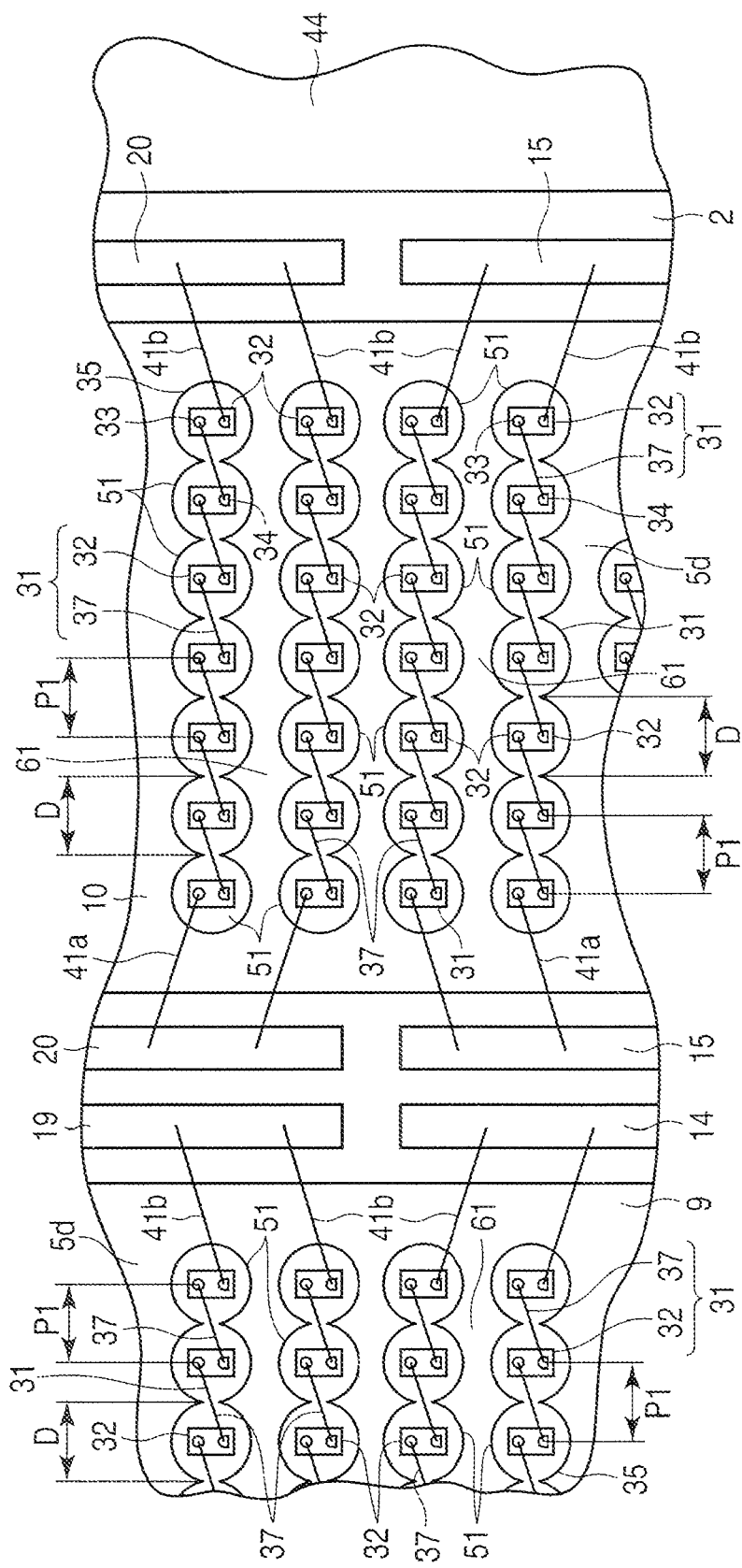
FIG. 14 is a plan view of a light emitting module according to a fourth embodiment of the present invention.

FIG. 14 discloses a fourth embodiment according to the present invention.

The fourth embodiment has relevance to the third embodiment. According to the fourth embodiment, respective light emitting diode elements 32 in light emitting diode strings 31 are bonded to a light reflecting surface 5*d* of a fifth metal reflective layer 10 through pad portions 51 of a die bond material 35. The pad portions 51 adjacent to each other in a direction along which the light emitting diode string 31 extends are arranged in such a manner that outer peripheral portions of the pad portions 51 become partially continuous.

On the other hand, outer edge portions of the pad portions 51 adjacent to each other in a direction orthogonal to the direction along which the light emitting diode string 31 extends are apart from each other. Therefore, each gap 61 is formed between the light emitting diode strings 31 adjacent to each other in the longitudinal direction of the fifth metal reflective layer 10. Each gap 61 extends in the width direction of the fifth metal reflective layer 10. A relationship between the light emitting diode string 31, the pad portion 51, and the gap 61 is the same in other metal reflective layers 6 to 9.

Even in such a fourth embodiment according to the present invention, a large quantity of light traveling from the light emitting diode elements 32 toward a module substrate 2 can be reflected in a light utilizing direction by the first to fifth metal reflective layers 6 to 10.

Furthermore, a corrosive gas or water vapor flowing toward silver layers 5*c* of the first to fifth metal reflective layers 6 to 10 through a sealing member 48 can be blocked by the respective pad portions 51 of the die bond materials 35. Therefore, the silver layers 5*c* of the first to fifth metal reflective layers 6 to 10 can be prevented from being discolored, and excellent light reflection performance of the first to fifth metal reflective layers 6 to 10 can be maintained.

On the other hand, at positions of the gaps 61 between the light emitting diode strings 31, light reflecting surfaces 5*d* are not covered with the die bond material 35, and the sealing member 48 is directly in contact with the light reflecting surfaces 5*d*. Therefore, the corrosive gas or the water vapor that has permeated the sealing member 48 reaches the light reflecting surfaces 5*d*, whereby the silver layers 5*c* are discolored.

Whereas, since the gaps 61 are apart from the light emitting diode elements 32, even if the silver layers 5*c* are discolored at the positions associated with the gaps 61, light reflection performance of the first to fifth metal reflective layers 6 to 10 is not adversely affected. Therefore, light emitted from the light emitting diode elements 32 can be efficiently extracted to the outside of a light emitting module 1.

In the third and fourth embodiments according to the present invention, each pad portion of the die bond material is not restricted to the circular shape. The shape of each pad may be, e.g., a diamond shape or a hexagonal shape.

Figure 15:
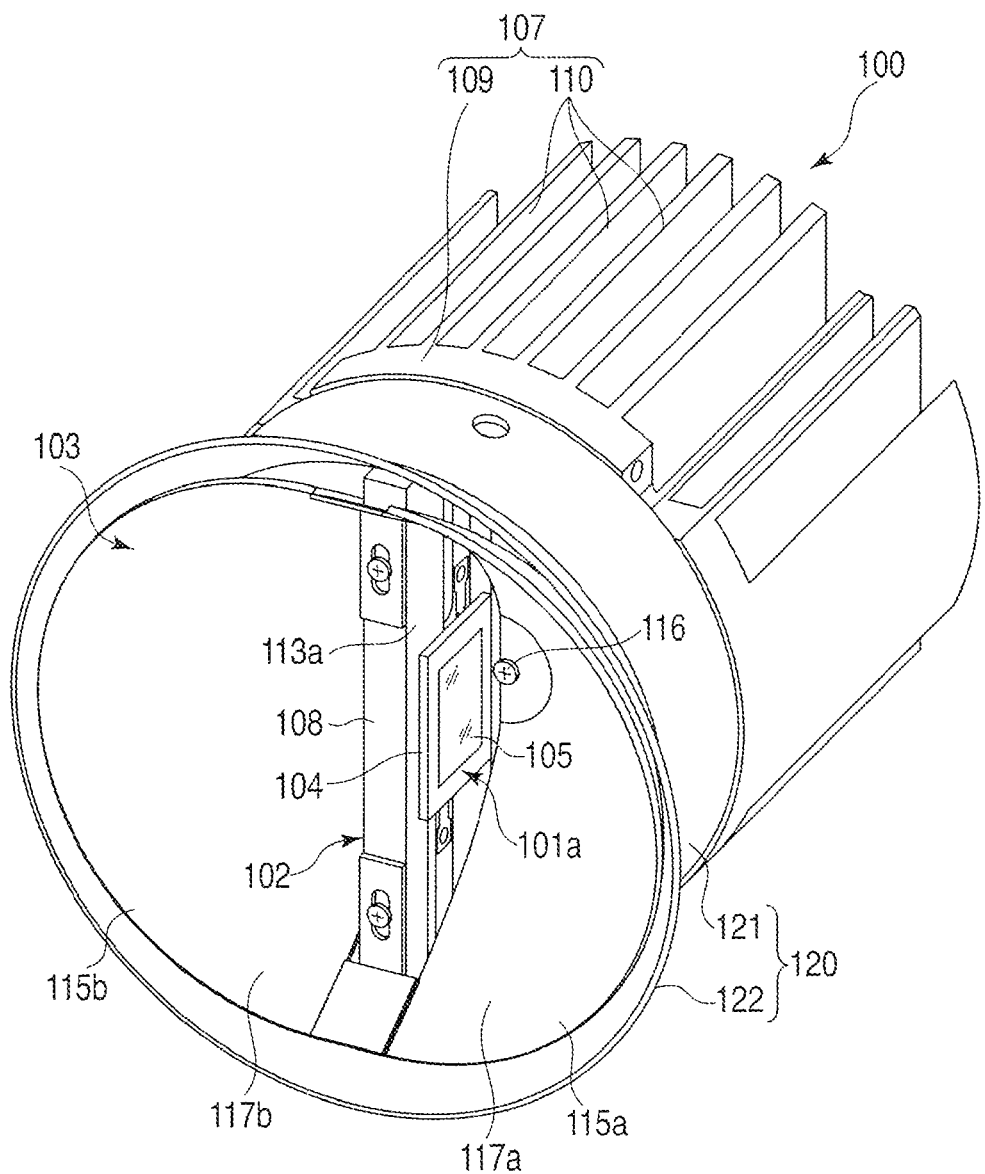
FIG. 15 is a perspective view of an illumination apparatus according to a fifth embodiment of the present invention.

FIG. 15 and FIG. 16 disclose a fifth embodiment according to the present invention.

The fifth embodiment discloses a specific configuration of a spotlight 100 which is an example of an illumination apparatus. The spotlight 100 includes a pair of light emitting modules 101*a* and 101*b*, a main body 102, and a reflection mirror 103.

Each of the light emitting module 101*a* and 101*b* has the same configuration as that of the light emitting module 1 according to the first embodiment and has a module substrate 104. A sealing member 105 is laminated on the module substrate 104. The sealing member 105 has optical transparency and seals light emitting diode elements and conductor patterns (both are not shown) on the module substrate 104. A surface of the module substrate 104 provided on the opposite side of the sealing member 105 is formed of a metal plate having excellent thermal conductivity like aluminum or copper.

As shown in FIG. 16, the main body 102 of the spotlight 100 includes a heat sink 107 and a heat receiving portion 108. The heat sink 107 is made of a lightweight metal material having excellent thermal conductivity like aluminum. The heat sink 107 includes a discoid base portion 109 and radiation fins 110 protruding from a back surface of the base portion 109. Each radiation fin 110 has a flat plate-like shape, and these fins are aligned parallel to each other at intervals.

The heat receiving portion 108 is made of a metal having excellent thermal conductivity like aluminum or copper and has a square plate-like shape with a predetermined thickness. The heat receiving portion 108 is fixed to a central portion of a surface of the base portion 109 through a screw 111. Therefore, the heat receiving portion 108 protrudes toward the opposite side of the radiation fins 110 from the surface of the base portion 106 and is thermally connected to the base portion 109.

As shown in FIG. 16, the heat receiving portion 108 has a first side surface 113*a* and a second side surface 113*b*. The first and second side surfaces 113*a* and 113*b* are parallel to each other and extend along the vertical direction.

The respective module substrates 104 of the light emitting modules 101*a* and 101*b* are fixed to the first and second side surfaces 113*a* and 113*b* of the heat receiving portion 108 through non-illustrated screws. The metal plate of each module substrate 104 faces a direction of each of the first and second side surfaces 113*a* and 113*b* of the heat receiving portion 108, and a heat transfer sheet 114 is interposed between the metal plate and each of the first and second side surfaces 113*a* and 113*b*. The heat transfer sheet 114 thermally connects the module substrate 104 to the heat receiving portion 108.

As the reflection mirror 103, a concave mirror is used. The reflection mirror 103 has a pair of reflection plates 115*a* and 115*b*. The respective reflection plates 115*a* and 115*b* are fixed to the surface of the base portion 109 of the heat sink 107 through screws 116. The reflection plates 115*a* and 115*b* are symmetrically arranged to sandwich the heat receiving portion 108 therebetween. Therefore, the light emitting module 101*a* fixed to the first side surface 113*a* of the heat receiving portion 108 faces a light reflecting surface 117*a* of the reflection plate 115*a*, and the light emitting module 101*b* fixed to the second side surface 113*b* of the heat receiving portion 108 faces a light receiving surface 117*b* of the reflection plate 115*b*.

In this embodiment, to reflect light emitted from the pair of light emitting modules 101*a* and 101*b* parallel to an optical axis L of the spot light 100, the center of a light emission region of each light emitting module 101*a* or 101*b* is placed at a focal point of each reflection mirror 115*a* or 115*b*.

As shown in FIG. 15 and FIG. 1.6, the reflection mirror 103 is surrounded by a cover 120. The cover 120 includes a cylindrical main body portion 121. One end of the main body portion 121 coaxially abuts on an outer peripheral portion of the surface of the base portion 109 of the heat sink 107. A flare portion 122 is coaxially formed at the other end of the main body portion 121. The flare portion 122 is flared toward the outer side parallel to the radial direction of the main body portion 121 as distanced from the main body portion 121. The flare portion 122 is in contact with the outer peripheral portion of the reflection mirror 103 adjacent to an opening end of the reflection mirror 103.

In the spotlight 100 having such a configuration, when the light emitting modules 101a and 101b are operated to emit light, white light transmitted through the sealing members 105 strikes the light reflecting surfaces 117a and 117b of the reflection plates 115a and 115b. The light that has struck the light reflecting surfaces 117a and 117b is reflected by the light reflecting surfaces 117a and 117b to become parallel to the optical axis L of the spotlight 100 and radiated toward an irradiation target from the opening end of the reflection mirror 103.

Each of the light emitting modules 101a and 101b serving as the light source of the spotlight 100 has the same configuration as that of the light emitting module 1 according to the first embodiment. Therefore, the light emitting modules 101a and 101b which have high manufacturing efficiency and are advantageous in terms of a cost can be utilized as the light source of the spotlight 100. Accordingly, a manufacturing cost of the spotlight 100 can be reduced, thereby providing the inexpensive spotlight 100.

Additionally, heat produced by the light emitting diode elements when the light emitting modules 101a and 101b emit light is transferred to the heat receiving portion 108 of the main body 102 from the metal plates of the module substrates 104. The heat of the light emitting diode elements transferred to the heat receiving portion 108 is conducted to the base portion 109 of the heat sink 107 from the heat receiving portion 108 and also discharged into air from the radiation fins 110 of the heat sink 107.

Therefore, heat from the light emitting modules 101a and 101b can be actively discharged by utilizing the main body 102 of the spotlight 100. Accordingly, an excessive increase in temperature of the light emitting diode elements included in the light emitting modules 101a and 101b can be avoided, and excellent light emission efficiency of the light emitting modules 101a and 101b can be maintained.

The illumination apparatus according to the present invention is not restricted to the spotlight, and it can be likewise carried out as other illumination apparatuses such as a downlight, a security light, a bracket light, or a pendant light.

Reference Signs List 1, 101a, and 101b . . . light emitting module, 2 and 104 . . . module substrate, 31 . . . light emitting diode string, 32 . . . light emitting diode element, 33 . . . anode element electrode, 34 . . . cathode element electrode, 37 . . . bonding wire, 48 and 105 . . . sealing member, 102 . . . main body.

The invention claimed claimed is:

1. A light emitting module comprising:
a module substrate;
a metal reflective layer which is laminated on module substrate and has a light reflecting surface;
a light emitting diode string comprising a plurality of light emitting diode elements, each of the light emitting diode elements comprising an anode element electrode and a cathode element electrode and having a rectangular shape that extends in a direction along which the element electrodes are aligned, and a plurality of bonding wires that electrically connect the light emitting diode elements adjacent to each other in series, the light emitting diode elements being fixed to the module substrate;
a plurality of translucent die bond materials interposed between the plurality of light emitting diode elements and the light reflecting surface, the plurality of translucent die bond materials bonding the plurality of light emitting diode elements to the metal reflective layer; and
a translucent sealing member laminated on the module substrate and configured to seal the light emitting diode string, wherein:
the light emitting diode elements are arranged at intervals in a direction crossing the direction along which the element electrodes are aligned;
the element electrodes having the same polarity are aligned to be adjacent to each other in an arrangement direction of the light emitting diode elements between the light emitting diode elements adjacent to each other;
each bonding wire is obliquely wired with respect to the arrangement direction of the light emitting diode elements to connect the element electrodes having different polarities of the light emitting diode elements adjacent to each other;
the plurality of translucent die bond materials are made of a resin material having lower gas permeability than a gas permeability of the sealing member;
the plurality of translucent die bond materials protrude around the plurality of light emitting diode elements on the metal reflective layer; and
peripheral portions of the plurality of translucent die bond materials are partially connected to one another.

2. The light emitting module according to claim 1, wherein each bonding wire protrudes to describe an arc in a direction away from the module substrate between the light emitting diode elements adjacent to each other, and a top portion of the bonding wire protrudes from the light emitting diode element to a height of 200 to 500 μm above the light emitting diode element.

3. The light emitting module according to claim 1, wherein the sealing member is made of a resin material.

4. The light emitting module according to claim 1, wherein the sealing member is made of a resin material softer than the plurality of translucent die bond materials.

5. The light emitting module according to claim 1, wherein the plurality of translucent die bond materials contain a phenyl silicone component.

6. The light emitting module according to claim 1, wherein both the plurality of translucent die bond materials and the sealing member contain a phenyl silicone material.

7. An illumination apparatus comprising:
a main body; and
a light emitting module supported by the main body,
the light emitting module comprising:
a module substrate;
a metal reflective layer which is laminated on module substrate and has a light reflecting surface;
a light emitting diode string comprising a plurality of light emitting diode elements, each of the light emitting diode elements comprising an anode element electrode and a cathode element electrode and having rectangular shape that extends in a direction along which the element electrodes are aligned, and a plurality of bonding wires that electrically connect the light emitting diode elements adjacent to each other in series, the light emitting diode elements being fixed to the module substrate;
a plurality of translucent die bond materials interposed between the plurality of light emitting diode elements and the light reflecting surface, the plurality of translucent die bond materials bonding the plurality of light emitting diode elements to the metal reflective layer; and
a translucent sealing member laminated on the module substrate and configured to seal the light emitting diode string, wherein:

the light emitting diode elements are arranged at intervals in a direction crossing the direction along which the element electrodes are aligned;

the element electrodes having the same polarity are aligned to be adjacent to each other in an arrangement direction of the light emitting diode elements between the light emitting diode elements adjacent to each other;

each bonding wire is obliquely wired with respect to the arrangement direction of the light emitting diode elements to connect the element electrodes having different polarities of the light emitting diode elements adjacent to each other;

the plurality of translucent die bond materials are made of a resin material having lower gas permeability than a gas permeability of the sealing member;

the plurality of translucent die bond materials protrude around the plurality of light emitting diode elements on the metal reflective layer; and peripheral portions of the plurality of translucent die bond materials are partially connected to one another.

8. The illumination apparatus according to claim 7, wherein the main body comprises:

a heat sink; and a heat receiving portion thermally connected to the heat sink, wherein the light emitting module is fixed to the heat receiving portion and thermally connected to the heat receiving portion.

9. The light emitting module according to claim 2, wherein the sealing member is made of a resin material.

10. The light emitting module according to claim 9, wherein the resin material is softer than the plurality of translucent die bond materials.

11. The light emitting module according to claim 9, wherein the plurality of translucent die bond materials contain a phenyl silicone component.

12. The light emitting module according to claim 9, wherein both the plurality of translucent die bond materials and the sealing member contain a phenyl silicone material.

* * * * *